(12) United States Patent
Han et al.

(10) Patent No.: US 9,281,479 B2
(45) Date of Patent: Mar. 8, 2016

(54) APPARATUS AND METHOD FOR FABRICATING ORGANIC LIGHT EMITTING DISPLAY

(71) Applicant: SAMSUNG DISPLAY CO. LTD., Yongin, Gyeonggi-Do (KR)

(72) Inventors: Jeong Won Han, Cheonan-Si (KR); Young Uk Lee, Cheonan-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 14/162,680

(22) Filed: Jan. 23, 2014

(65) Prior Publication Data

US 2015/0044930 A1    Feb. 12, 2015

(30) Foreign Application Priority Data

Aug. 9, 2013    (KR) .................. 10-2013-0094940

(51) Int. Cl.
*H05B 33/00*    (2006.01)
*H01J 9/00*    (2006.01)
*H01L 51/00*    (2006.01)

(52) U.S. Cl.
CPC .................. *H01L 51/0011* (2013.01)

(58) Field of Classification Search
None
See application file for complete search history.

(56) References Cited

U.S. PATENT DOCUMENTS

| 2004/0104197 | A1* | 6/2004 | Shigemura et al. | 216/20 |
| 2014/0356999 | A1* | 12/2014 | Jang | 438/34 |
| 2014/0370633 | A1* | 12/2014 | Chang et al. | 438/46 |

FOREIGN PATENT DOCUMENTS

| JP | 2012-133122 A | 7/2012 |
| KR | 1995-0016481 A | 6/1995 |
| KR | 1999-004452 A | 1/1999 |
| KR | 10-1999-0054768 A | 7/1999 |
| KR | 10-2000-0059972 A | 10/2000 |
| KR | 10-2004-0014258 A | 2/2004 |
| KR | 10-2004-0087142 A | 10/2004 |

* cited by examiner

*Primary Examiner* — Ashok Patel
(74) *Attorney, Agent, or Firm* — Christie, Parker & Hale, LLP

(57) ABSTRACT

An apparatus for fabricating an organic light emitting display includes a chamber, a stage having a hollow portion, a displacement sensor on the stage and configured to measure a distance between the stage and a measurement target that is on or over an upper part of the stage, and a controller. The controller includes an input unit configured to receive distance information obtained by the displacement sensor, a memory unit configured to store reference distance information, a determination unit configured to compare the distance information received by the input unit with the reference distance information, and an output unit configured to output a variable control signal according to whether or not the determination unit determines that the distance information between the stage and the measurement target corresponds to the reference distance information. A method for fabricating an organic light emitting display using the apparatus is also provided.

22 Claims, 20 Drawing Sheets

APPARATUS AND METHOD FOR FABRICATING ORGANIC LIGHT EMITTING DISPLAY

CROSS-REFERENCE TO RELATED APPLICATION

This application claims priority to and the benefit of Korean Patent Application No. 10-2013-0094940, filed on Aug. 9, 2013 in the Korean Intellectual Property Office, the disclosure of which is incorporated herein in its entirety by reference.

BACKGROUND

1. Field

The present invention relates to an apparatus and method for fabricating an organic light emitting display, and more particularly to an apparatus and method for fabricating a large-area organic light emitting display.

2. Description of the Related Art

A display device that displays various kinds of information on a screen is a core technology of the information and communication age, and has been developed such that the display device is thin, light-weight, and portable, but the performance of the display device is also improved. Accordingly, a flat-panel display, such as an organic light emitting display, which can reduce the weight and volume of the display as compared with a cathode ray tube (CRT), has been spotlighted.

The organic light emitting display may include electrodes and an intermediate layer including a light emitting layer, and the electrodes and the intermediate layer may be formed by various methods, and one such method is a vacuum deposition process.

In order to form an organic material layer of the organic light emitting display, a vacuum deposition process for depositing an organic material on a substrate has been widely used, and in such a vacuum deposition process, a deposition source for injecting an organic material that is evaporated in a vacuum chamber may be used. In the vacuum deposition process, a substrate is arranged on or over a mask having apertures of a specific shape, and the deposition source provides a material for forming a thin film from a side of the mask toward the substrate. In order to produce a high-resolution organic light emitting display using the vacuum deposition method, a deposition material should be accurately deposited onto the substrate, and for this, a distance between the substrate and the mask should remain constant.

SUMMARY

Accordingly, one aspect of embodiments according to the present invention is an apparatus for fabricating an organic light emitting display, which can measure a distance between a stage and a mask frame in real-time and can promptly take follow-up measures when the distance between the stage and the mask frame becomes abnormal during a process.

Another aspect of embodiments according to the present invention is an apparatus for fabricating an organic light emitting display which can keep a distance between a stage and a mask frame constant and thus, can reduce or prevent the occurrence of product inferiority (e.g., product defects) due to an abnormal distance between the stage and the mask frame.

Still another aspect of embodiments according to the present invention is a method for fabricating an organic light emitting display which can measure a distance between a stage and a mask frame in real-time and can promptly take follow-up measures when the distance between the stage and the mask frame becomes abnormal during a process.

According to an embodiment of the present invention, an apparatus for fabricating an organic light emitting display includes a chamber, a stage having a hollow portion, a displacement sensor on the stage and configured to measure a distance between a measurement target that is on or over an upper part of the stage, and a controller. The controller includes an input unit configured to receive distance information obtained by the displacement sensor, a memory unit configured to store reference distance information, a determination unit configured to compare the obtained distance information received by the input unit with the reference distance information, and an output unit configured to output a variable control signal according to whether or not determination unit determines that the obtained distance information between the stage and the measurement target corresponds to the reference distance information.

According to another embodiment of the present invention, a method for fabricating an organic light emitting display includes preparing a stage having a hollow portion and a mask frame on or over the stage and coupled to a mask sheet, obtaining distance information between the stage and the mask frame, determining whether or not the obtained distance information between the stage and the mask frame corresponds to reference distance information, and controlling a source unit to provide a thin-film forming material toward the stage.

The obtaining the distance information between the stage and the mask may include using a displacement sensor on the stage to measure a distance between the stage and the mask frame.

The determining whether or not the obtained distance information between the stage and the mask frame corresponds to the reference distance information may be performed by a controller that may include an input unit receiving the obtained distance information between the stage and the mask frame, a memory unit storing the reference distance information, and a determination unit determining whether or not the obtained distance information between the stage and the mask frame corresponds to the reference distance information.

The controller may also include an output unit outputting a variable control signal according to whether or not the determination unit determines that the obtained distance information between the stage and the mask frame corresponds to the reference distance information.

The controlling the source unit may include a driving unit included in the source unit driving the source unit to receive the variable control signal, and operating or stopping the source unit according to the received control signal.

When the determination unit determines that the obtained distance information between the stage and the mask frame corresponds to the reference distance information, the output unit may output a first control signal, and when the determination unit determines that the obtained distance information between the stage and the mask frame does not correspond to the reference distance information, the output unit may output a second control signal, and when the first control signal is received, the driving unit may operate the source unit, while when the second control signal is received, the driving unit may stop the source unit.

An alarm may also be generated when the obtained distance information between the stage and the mask frame does not correspond to the reference distance information.

The obtained distance information between the stage and the mask frame and/or whether or not the obtained distance information between the stage and mask frame corresponds to the reference distance information may be displayed.

The obtaining the distance information between the stage and the mask frame and then determining whether or not the obtained distance information between the stage and the mask frame corresponds to the reference distance information may be continuously performed while the controlling the source unit is performed.

The source unit may be stopped when it is determined that a distance between the stage and a substrate, which may be estimated during performing of the controlling the source unit, does not correspond to the reference distance information.

According to another embodiment of the present invention, a method for fabricating an organic light emitting display includes preparing a stage having a hollow portion and a mask frame on or over the stage and coupled to a mask sheet, and arranging a substrate on the mask sheet, obtaining first distance information between the stage and the mask frame, estimating a second distance between the stage and the substrate based on the obtained first distance information, determining whether or not the estimated second distance corresponds to the reference distance information, and controlling a source unit to provide a thin-film forming material toward the stage.

The obtaining the first distance information may include using a displacement sensor on the stage to measure a distance between the stage and the mask frame.

The estimating the second distance and the determining whether or not the estimated second distance corresponds to the reference distance information may be performed by a controller that may include an input unit receiving the obtained first distance information, an operation unit estimating the second distance, a memory unit storing the reference distance information, and a determination unit determining whether or not the estimated second distance corresponds to the reference distance information.

The controller may also include an output unit outputting a variable control signal according to whether or not the determination unit determines that the estimated second distance corresponds to the reference distance information.

The controlling the source unit may include a driving unit included in the source unit driving the source unit to receive the variable control signal, and operating or stopping the source unit according to the received control signal.

When the determination unit determines that the estimated second distance corresponds to the reference distance information, the output unit may output a first control signal, while when the determination unit determines that the estimated second distance does not correspond to the reference distance information, the output unit may output a second control signal, and when the first control signal is received, the driving unit may operate the source unit, while when the second control signal is received, the driving unit may stop the source unit.

An alarm may also be generated when the estimated second distance does not correspond to the reference distance information.

The estimated second distance and/or whether or not the estimated second distance corresponds to the reference distance information may be displayed.

The obtaining the first distance information, the estimating the second distance, and the determining whether or not the estimated second distance corresponds to the reference distance information may be continuously performed while the controlling the source unit is performed.

The source unit may be stopped when the estimated second distance does not correspond to the reference distance information.

The obtaining the distance information may include using a plurality of displacement sensors on the stage to measure a corresponding plurality of distances between the stage and the mask frame, one piece of the distance information may be obtained by a corresponding one of the plurality of displacement sensors, and the determining whether or not the obtained distance information between the stage and the mask frame corresponds to the reference distance information may include determining whether or not the pieces of the distance information correspond to the reference distance information.

The obtaining the first distance information may include using a plurality of displacement sensors on the stage to measure a corresponding plurality of distances between the stage and the mask frame, one piece of the distance information being obtained by a corresponding one of the plurality of displacement sensors, the estimating the second distance may include estimating a plurality of second distances, each of the estimated second distances corresponding to one piece of the distance information, and the determining whether or not the estimated second distance corresponds to the reference distance information may include determining whether or not the plurality of estimated second distances corresponds to the reference distance information.

Detailed elements of other example embodiments are included in the detailed description and drawings.

According to embodiments of the present invention, at least the following effects can be achieved.

For example, the abnormal distance between the stage and the mask frame may be detected in real-time and not only before the process but also during the proceedings of the process.

Further, the distance between the stage and the mask frame may be kept uniform, and thus the inferiority of the product may be prevented from occurring.

The aspects and characteristics according to embodiments of the present invention are not limited to the contents as provided above for example. Additional aspects and/or characteristics of the invention will be set forth in part in the description which follows and, in part, will be apparent to those having ordinary skill in the art upon examination of the following or may be learned from practice of the invention.

BRIEF DESCRIPTION OF THE DRAWINGS

The above and other features and aspects of the present invention will be more apparent from the following detailed description taken in conjunction with the accompanying drawings, in which.

DETAILED DESCRIPTION

Figure 1:
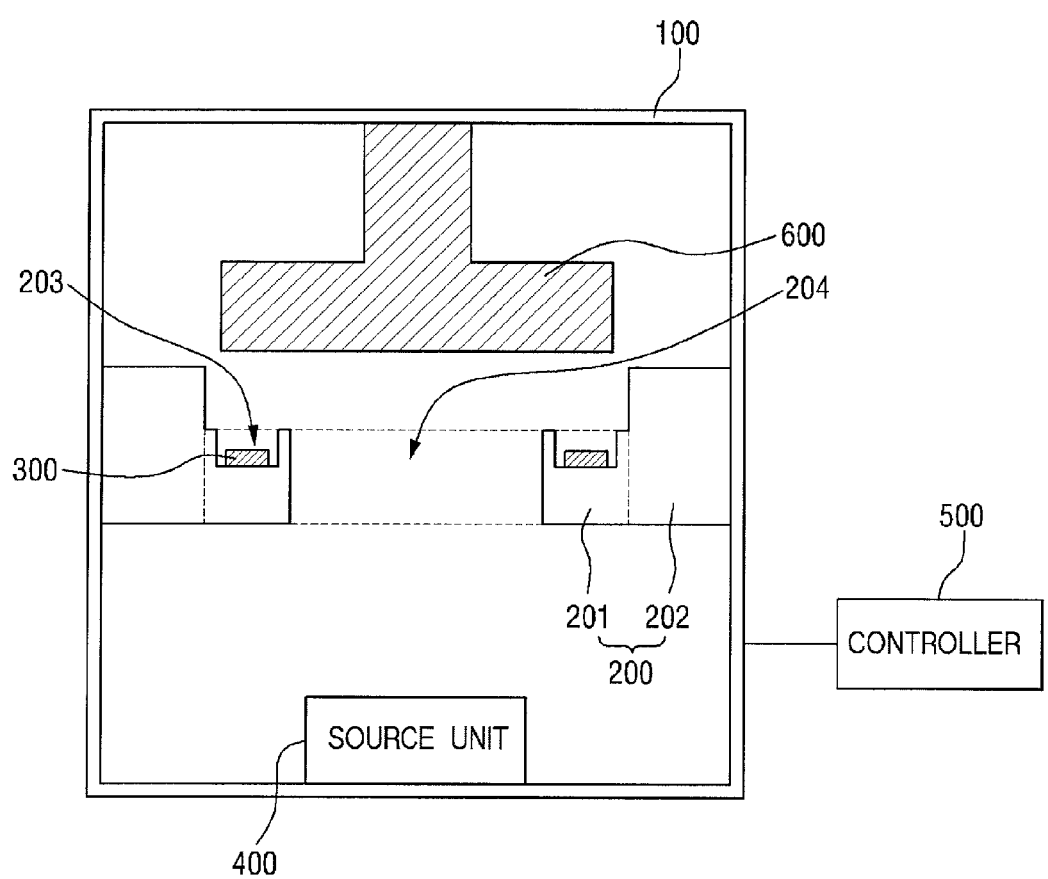
FIG. 1 is a cross-sectional view of an apparatus for fabricating an organic light emitting display according to an embodiment of the present invention.

The aspects and features of the present invention and methods for achieving the aspects and features will be more apparent by referring to the embodiments to be described in detail with reference to the accompanying drawings. However, the present invention is not limited to the embodiments disclosed hereinafter and can be implemented in diverse forms. The matters defined in the description, such as the detailed construction and elements, are nothing but specific details provided to assist those of ordinary skill in the art in a comprehensive understanding of the invention, and the present invention is defined within the scope of the appended claims and their equivalents.

The term "on" that is used to designate that an element is on another element or located on a layer includes both a case where an element is located directly on another element or a layer and a case where an element is located on another element via another layer or still another element. In the entire description of the present invention, the same drawing reference numerals are used for the same elements across various figures.

Although the terms "first, second" and so forth are used to describe diverse elements, such elements are not limited by the terms. The terms are used only to discriminate an element from other elements. Accordingly, in the following description, a first element may be a second element and vice versa.

Hereinafter, certain example embodiments of the present invention will be described in detail with reference to the accompanying drawings.

Figure 2:
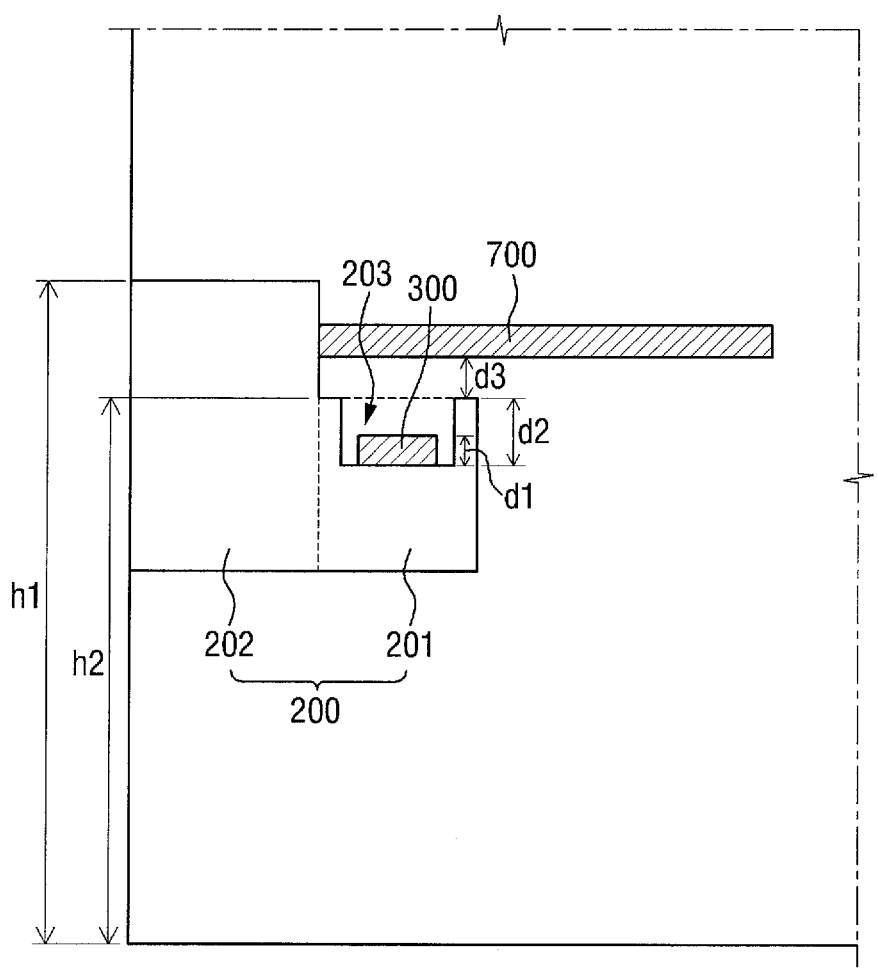
FIG. 2 is a partial cross-sectional view of an apparatus for fabricating an organic light emitting display according to an embodiment of the present invention.
Figure 3:
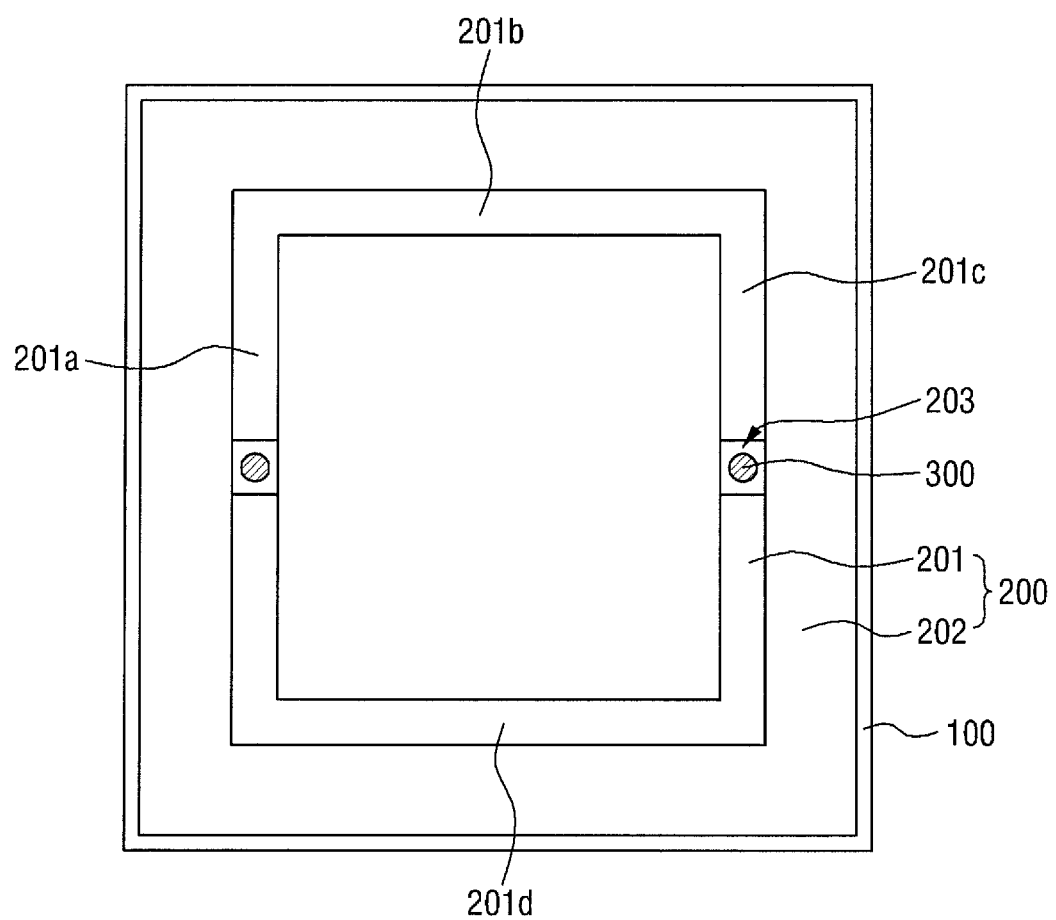
FIG. 3 is a partial plan view of an apparatus for fabricating an organic light emitting display according to an embodiment of the present invention.
Figure 4:
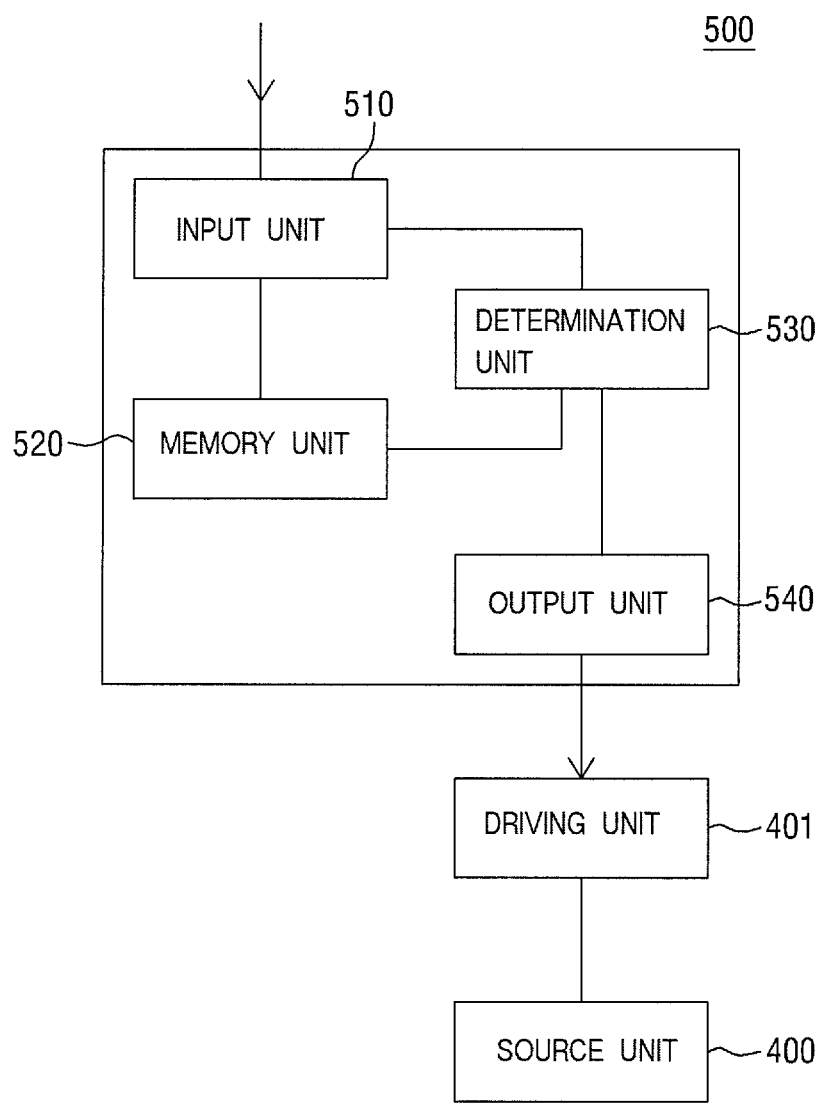
FIG. 4 is a partial block diagram of an apparatus for fabricating an organic light emitting display according to an embodiment of the present invention.

FIG. 1 is a cross-sectional view of an apparatus for fabricating an organic light emitting display according to an embodiment of the present invention, FIG. 2 is a partial cross-sectional view of an apparatus for fabricating an organic light emitting display according to an embodiment of the present invention, and FIG. 3 is a partial plan view of an apparatus for fabricating an organic light emitting display according to an embodiment of the present invention. FIG. 4 is a partial block diagram of an apparatus for fabricating an organic light emitting display according to an embodiment of the present invention.

Referring to FIGS. 1 to 4, an apparatus 1000 for fabricating an organic light emitting display according to an embodiment of the present invention includes a chamber 100, a stage 200 having a hollow portion 204 (e.g., an opening), a displacement sensor 300 arranged on the stage 200 to measure (e.g., configured to measure) distance information (e.g., a distance or a first distance) of a measurement target 700 that is positioned on or above an upper part of the stage 200, and a controller 500. The controller 500 includes an input unit 510 for receiving (e.g., configured to receive) the distance information measured by the displacement sensor 300, a memory unit 520 for storing (e.g., configured to store) reference distance information (e.g., a reference distance or a reference distance range), a determination unit 530 for comparing (e.g., configured to compare) the distance information received by the input unit 510 with the reference distance information, and an output unit 540 for outputting (e.g., configured to output) control signals (e.g., a variable control signal) corresponding to or based on the information determined by the determination unit 530.

The chamber 100 may have a space (e.g., a space having a predetermined size) therein. In the space of the chamber 100, various elements to be further described later may be arranged. The chamber 100 may have a cuboidal shape, but the shape of the chamber 100 is not limited thereto. The chamber 100 may separate (e.g., seal) an inside of the chamber 100 from an outside of the chamber 100. That is, the inside of the chamber 100 may be isolated from the outside of the chamber 100. In an example embodiment, the inside of the chamber 100 may be in a vacuum state but is not limited thereto. If necessary, the inside of the chamber 100 may be connected to the outside of the chamber 100.

The stage 200 may be arranged in the chamber 100. The stage 200 may be arranged to be spaced apart (e.g., spaced apart by a predetermined distance) from a bottom surface of the chamber 100. In order for the stage 200 to be spaced apart from the bottom surface of the chamber 100, a side surface of the stage 200 may be coupled to (e.g., installed on) an inner side wall of the chamber 100. However, the installation method and position of the stage 200 is not limited thereto.

The stage 200 may have (e.g., include) the hollow portion 204. That is, the hollow portion 204 of the stage 200 may extend through (e.g., completely penetrate) the stage 200. The hollow portion 204 may have a rectangular shape, but is not limited thereto. The hollow portion 204 may have a circular shape or may include a curve, at least partially. The hollow portion 204 of the stage 200 may expose at least a portion of a bottom surface of the measurement target 700 that is arranged on or over the stage 200. In an example embodiment, an area (e.g., a surface area) of the measurement target 700 that is arranged on or over an upper part of the stage 200 may be larger (e.g., substantially larger) than the area of the hollow portion 204. If the area of the measurement target 700 is larger than the area of the hollow portion 204, the target is unable to pass through or into the hollow portion 204 and may be placed on (e.g., rest on) the stage 200. However, the size of the measurement target 700 is not limited thereto.

One side wall of the stage 200 may include a support 202 that comes in contact with the chamber 100 and a seat portion 201 on which the measurement target 700 may be located or seated. The shape of the stage 200 will be described in further detail with reference to FIG. 2.

FIG. 2 illustrates a case where a certain measurement target 700 is arranged on or over the stage 200, in an example embodiment in which the stage 200 includes the support 202 and the seat portion 201. The seat portion 201 may be formed to be recessed from an upper surface of the support 202 (e.g., recessed by a predetermined distance) so that the measurement target 700 is stably or fully seated on the seat portion 201. That is, the height h2 from the bottom surface of the chamber 100 to an upper surface of the seat portion 201 may be less than the height h1 from the bottom surface of the chamber 100 to the upper surface of the support 202. In other words, because a side surface of the measurement target 700 may come in contact with the other side wall of the support 202 and a bottom surface of the measurement target 700 may come in contact with the upper surface of the seat portion 201, the measurement target 700 can be stably seated on the stage 200 without being movable left and right.

On the seat portion 201 of the stage 200, at least one accommodation groove 203, which is recessed from the upper surface of the seat portion 201 towards a lower side of the seat portion 201, may be formed. The accommodation groove 203 may be formed having a cuboidal shape, but the shape of the accommodation groove 203 is not limited thereto. The accommodation groove 203 may have a circular shape or may include a curve, at least partially. The displacement sensor 300, to be further described later, may be accommodated in the accommodation groove 203.

The displacement sensor 300 may be arranged on the stage 200. The displacement sensor 300 may measure a distance between the measurement target 700 that is arranged on or over the upper part of the stage 200 For example, a distance between the upper surface of the stage 200 and the bottom surface of the measurement target 700 may be measured. In an example embodiment in which the stage 200 includes the seat portion 201 and the support 202, the displacement sensor 300 may measure a distance d3 between the upper surface of the seat portion 201 and the bottom surface of the measurement target 700, but is not limited thereto. Further, the distance d3 between the upper surface of the seat portion 201 and the bottom surface of the measurement target 700 may be "0" or may be larger than "0". If the distance d3 between the upper surface of the seat portion 201 and the bottom surface of the measurement target 700 is "0", it means that the upper surface of the seat portion 201 and the measurement target 700 are in physical contact with each other.

Further details of the distance information (e.g., the distance) corresponding to the measurement target 700 that is measured by the displacement sensor 300 will be described later.

A distance d2 between the upper surface of the accommodation groove 203 and the upper surface of the seat portion 201 may be larger than or equal to a distance d1 between the upper surface of the accommodation groove 203 and an uppermost part of the displacement sensor 300. That is, the uppermost part of the displacement sensor 300 may be at substantially the same plane or level as the upper surface of the seat portion 201 or may be lower than the upper surface of the seat portion 201. However, the present invention is not limited thereto, and at least a part of the displacement sensor 300 may project from the upper surface of the seat portion 201 depending on the type of the displacement sensor 300.

The displacement sensor 300 may include all types of linear displacement sensors. That is, the displacement sensor 300 may be a non-contact type displacement sensor, and may be at least one selected from the group including an eddy current type displacement sensor, a magnetic displacement sensor, an optical displacement sensor, and an electromagnetic induction type displacement sensor. However, the above-listed types of displacement sensors are provided as examples, and the scope of the present invention is not limited by the types of displacement sensors.

At least one displacement sensor 300 may be arranged on the seat portion 201 of the stage 200.

Referring again to FIGS. 1 to 3, two displacement sensors 300 may be arranged on the seat portion 201 of the stage 200 that is adjacent to the hollow portion 204 of the stage 200.

For convenience of explanation, in the embodiment shown in FIG. 3, in which the seat portion 201 has the rectangular shape, a plurality of seat portions 201 may be present and, arranged clockwise from the left, are called first to fourth seat portions 201a to 201d. However, the shape of the seat portions 201 illustrated in FIG. 3 is provided as an example, and the scope of the present invention is not limited thereto. That is, the plurality of seat portions 201 may have a round shape including a curve, at least partially, or may have a square shape. In other words, the shape of the seat portion may differ corresponding to the shape of a mask frame arranged on the seat portion or a substrate.

The displacement sensors 300 may be arranged on the first seat portion 201a and the third seat portion 201c that faces (e.g., is across from) the first seat portion 201a. Further, the respective displacement sensors 300 may be arranged on a center part of the first seat portion 201a and a center part of the third seat portion 201c. However, this is merely provided as an example, and the positions of the displacement sensors 300 are not limited thereto. That is, the displacement sensors 300 may be arranged on the first seat portion 201a and the second seat portion 201b that are next to (e.g., vertically arranged with respect to) each other, or may be arranged on edge parts (e.g., off-center parts) of the respective seat portions 201 rather than the center parts thereof.

Although FIG. 2 illustrates two displacement sensors 300 arranged on the stage 200, the number of displacement sensors 300 and the positions thereof are not limited thereto. That is, one or more displacement sensors 300 may be provided, and thus various sensor arrangements may be provided accordingly. Various modified embodiments in which a plurality of displacement sensors 300 are provided will be described later.

The apparatus for fabricating an organic light emitting display according to an embodiment of the present invention may include the controller 500. The controller 500 will be described in detail with reference to FIG. 4.

Referring to FIG. 4, the controller 500 of the apparatus for fabricating an organic light emitting display according to an embodiment of the present invention includes an input unit 510 for receiving the distance information obtained (e.g., measured) by the displacement sensor 300, a memory unit 520 for storing the reference distance information, a determination unit 530 for comparing the distance information received by the input unit 510 with the reference distance information, and an output unit 540 for outputting control signals based on the information determined by the determination unit 530.

As described above, the displacement sensor 300 may obtain (e.g., measure) the distance information between the stage 200 and the measurement target 700 that is arranged on or over the stage 200 (e.g., the first distance or the first distance information). The distance information between the stage 200 and the measurement target 700 that is arranged on or over the stage 200, which is obtained by the displacement sensor 300, may be inputted to the input unit 510.

The reference distance information may be inputted to the memory unit 520. The reference distance information is distance information (e.g., a predetermined distance or predetermined distance information) between the stage 200 and the measurement target 700. That is, the reference distance information may be distance information in a state where the measurement target is stably seated, and may include distance information of or corresponding to a predetermined value or in a predetermined range. Further, the reference distance information may include experimental data.

The reference distance information may include a case where the distance between the stage 200 and the measurement target 700 is "0". If the distance between the stage 200 and the measurement target 700 that is arranged on or over the stage 200 is "0", it means that the stage 200 and the measurement target 700 that is arranged on or over the stage 200 are in physical contact with each other, and in this case, the measurement target 700 is stably seated on the stage 200.

The determination unit 530 may compare the distance information between the stage 200 and the measurement target 700 arranged on or over the stage 200, which is received by the input unit 510, with the reference distance information stored in the memory unit 520. That is, the determination unit 530 may determine whether or not the distance between the stage 200 and the measurement target 700 arranged on or over the stage 200, which is received by the input unit 510, is included in or corresponds to the reference distance information stored in the memory unit 520. In other words, as described above, the reference distance information may include distance information corresponding to a range (e.g., a predetermined range), and the determination unit 530 may determine whether or not the distance between the stage 200 and the measurement target 700 arranged on or over the stage 200, which is obtained by the displacement sensor 300, is included in or corresponds to the reference distance information. Depending on whether or not the distance information between the stage 200 and the measurement target 700 arranged on or over the stage 200, which is measured by the displacement sensor 300, is included in or corresponds to the reference distance information, the output unit 540, to be further described later, may output one of at least two different control signals (e.g., a variable control signal).

The output unit 540 may output the control signals based on the information determined by the determination unit 530. As described above, the determination unit 530 may compare the reference distance information stored in the memory unit 520 with the distance information between the stage 200 and the measurement target 700 arranged on or over the stage 200, which is received by the input unit 510. In an example embodiment, when the determination unit 530 determines that the distance information between the stage 200 and the measurement target 700 arranged on or over the stage 200, which is received by the input unit 510, is included in or corresponds to the reference distance information, the output unit 540 may output a first control signal, while when the determination unit 530 determines that the distance information between the stage 200 and the measurement target 700 arranged on or over the stage 200, which is received by the input unit 510, deviates from or does not correspond to the reference distance information, the output unit 540 may output a second control signal.

The first control signal and the second control signal may be received by a driving unit 401 that drives a source unit 400, and the driving unit 401 may drive (e.g., activate) the source unit 400 according to (e.g., based on) the first control signal or the second control signal. For example, when the driving unit 401 receives the first control signal, the driving unit 401 may drive the source unit 400 when it is in a standstill state or, when the source unit 400 is activated or moving, may maintain (e.g., keep) the state of the source unit 400 as it is. When the driving unit 401 receives the second control signal, the driving unit 401 may maintain the state of the source unit 400 when it is in a standstill state or may stop the source unit 400 when it is in an activated or moving state. However, the driving of the source unit 400 according to the first control signal or the second control signal as described above is provided as an example, and the control method of the source unit 400 according to the respective control signals is not limited thereto.

As described above, the apparatus for fabricating an organic light emitting display according to some embodiments of the present invention may include a plurality of displacement sensors 300. When the apparatus for fabricating an organic light emitting display according to some embodiments of the present invention includes the plurality of displacement sensors 300, each of the displacement sensors 300 may measure distance information of points on the measurement target 700 corresponding to the position of each of the respective displacement sensors 300. In an example embodiment, the points measured on the measurement target 700 corresponding to each of the respective displacement sensors 300 may correspond to positions above each of the respective displacement sensors 300, but are not limited thereto. In the embodiment where the plurality of displacement sensors 300 obtain the distance information of points on the measurement target 700 corresponding to the position of each of the respective displacement sensors 300, the distance information between the measurement target 700 and the stage 200, which is obtained by the respective displacement sensors 300, may be received in the input unit 510. In this case, the determination unit 530 may compare the distance information between the measurement target 700 and the stage 200, which is obtained by the respective displacement sensors 300, with the reference distance information. Further, as described above, the output unit 540 may output one of the at least two control signals based on the information that is determined by the determination unit 530. That is, when the determination unit 530 determines that pieces of the distance information obtained by the plurality of displacement sensors 300 is included in or corresponds to the reference distance information, the output unit 540 may output the first control signal. Further, when the determination unit 530 determines that at least one of the pieces of the distance information obtained by one of the plurality of displacement sensors 300 deviates from or does not correspond to the reference distance information, the output unit 540 may output the second control signal. However, this is provided as an example, and the control signals output from the output unit 540 are not limited thereto. That is, the controller 500 may be freely programmed so that when at least some of the pieces of the distance information obtained by the displacement sensors 300 are included in or correspond to the reference distance information, the controller 500 outputs the first control signal, while when less than some of the pieces of the distance information are included in or correspond to the reference distance information, the controller 500 outputs the second control signal (e.g., when more than some of the pieces of the distance information deviate from or do not correspond to the reference distance information, the controller 500 outputs the second control signal).

The obtaining of the distance information by the displacement sensors 300 and the corresponding operation of the controller 500 may continue before and after a thin-film forming process. That is, a series of operations, which obtains the distance information between the stage 200 and the measurement target 700 using the displacement sensors 300, receiving and determining the obtained distance information, and outputting the control signals, may be continuously performed (e.g., repeatedly performed) not only before thin-film forming, to be described later, starts but also during the thin-film forming process. In other words, the series of operations, which obtains the distance information between the stage 200 and the measurement target 700 using the displacement sensors 300, receiving and determining the obtained distance information, and outputting the control signals, may be performed in real-time throughout the thin-film forming process. By performing the above-described operations in real-time before the process and during the process, it is possible to identify and correct a seating abnormality of the measurement target 700 before the process starts, and if the seating abnormality occurs during the process, it is possible to stop the process in order to have an opportunity to correct the seating abnormality. Accordingly, production of inferior or defective products, which may occur due to overlooking or non-identification of the seating abnormality, can be prevented.

The series of operations, which obtains the distance information between the stage 200 and the measurement target 700 using the displacement sensors 300, receiving and determining the obtained distance information, and outputting the control signals, may be performed continuously or intermittently. That is, the above-described series of operations may be continuously performed without interruption, or may be performed at intervals (e.g., predetermined intervals).

Referring again to FIG. 1, the apparatus 1000 for fabricating an organic light emitting display may further include a chuck 600 arranged on or above an upper part of the stage 200 and the source unit 400. The source unit 400 may be arranged at a bottom part of the chamber 100 (e.g., arranged under a bottom part of the stage 200). The source unit 400 may provide sources to various processes that are required to fabricate the organic light emitting display. For example, the source unit 400 may provide a material for forming a thin film on the measurement target 700 that is arranged on or over the stage 200, but is not limited thereto. Further, the source unit 400 may provide a material used to form the thin film or an etchant using various methods. For example, the source unit 400 may provide a material used to form the thin film or an etchant using a spray method or a deposition method. However, this is provided as an example, and the material transfer method of the source unit 400 is not limited thereto.

The chuck 600 may be arranged on or over the stage 200. The chuck 600 may apply a force to the measurement target 700 that is arranged on or over the stage 200 inside the chamber 100 in a direction opposite to the direction gravity acts. That is, the measurement target 700 arranged on or over the stage 200 may partially droop (e.g., sag) due to gravity. However, the chuck 600 arranged on or over the stage 200 applies the force to the measurement target 700 in the direction opposite to the gravity, and thus the measurement target 700 is prevented from drooping. For example, the chuck 600 may apply an attractive force to the measurement target 700 arranged on or over the stage 200 in a direction from the upper part of the stage 200 towards the chuck 600. The method for the chuck 600 to apply the force to the measurement target 700 is not limited thereto, and the chuck 600 may apply the force to the measurement target 700 through, for example, any one of a method using an electrostatic force, a method using a magnetic or electromagnetic force, and a vacuum attraction method.

The chuck 600 may be arranged adjacent to the measurement target 700, but is not limited thereto. The chuck 600 may come in contact with the measurement target 700, at least partially. Further, an area (e.g., a surface area) of the chuck 600 that faces the measurement target 700 may be substantially equal to or larger than a corresponding area of the measurement target 700. That is, an upper part (e.g., an upper surface) of the measurement target 700 may be completely covered or contacted by the chuck 600.

Hereinafter, a method for fabricating an organic light emitting device according to another embodiment of the present invention will be described. In the following embodiment, the same reference numerals are used for the same configurations and elements as the configurations and elements described above, and duplicate explanations thereof may be omitted or simplified.

Figure 5:
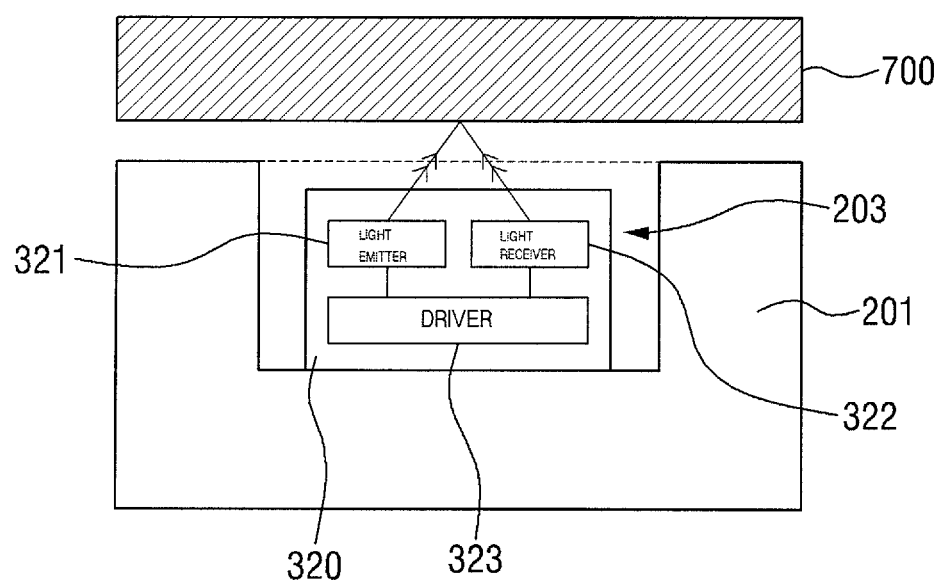
FIG. 5 is a schematic cross-sectional view of a displacement sensor of an apparatus for fabricating an organic light emitting display according to another embodiment of the present invention.

FIG. 5 is a schematic cross-sectional view of a displacement sensor 320 of an apparatus for fabricating an organic light emitting display according to another embodiment of the present invention.

Referring to FIG. 5, the displacement sensor 320 of an apparatus for fabricating an organic light emitting display according to another embodiment of the present invention is a non-contact type displacement sensor and includes a light emitter 321 and a light receiver 322.

In the apparatus for fabricating an organic light emitting display according to some embodiments of the present invention as described above, the displacement sensor may be a contact-type displacement sensor or a non-contact-type displacement sensor. FIG. 5 illustrates the displacement sensor 320 as an optical displacement sensor, that is, one of non-contact-type displacement sensors. However, this is provided as an example, and the scope of the present invention is not limited thereto.

In an example embodiment, the optical displacement sensor 320 may include a light emitter 321, a light receiver 322, and a driver 323 for controlling (e.g., configured to control) the light emitter 321 and the light receiver 322.

The optical displacement sensor 320 may be inserted into the accommodation groove 203 arranged on the stage 200. For example, the optical displacement sensor 320 may be arranged on the seat portion 201 of the stage 200, and may be arranged in the accommodation groove 203 that is recessed downward from the upper surface of the seat portion 201. The uppermost part of the optical displacement sensor 320 may be positioned at the same plane or level as the upper surface of the seat portion 201 or below the upper surface of the seat portion 201.

The light emitter 321 may emit light toward the bottom surface of the measurement target 700 that is arranged on or over the upper surface of the stage 200, and the light receiver 322 may receive the light that is reflected from the bottom surface of the measurement target 700. The optical displacement sensor 320 may receive the light that is reflected from the measurement target 700, and thus may measure the distance between the displacement sensor 320 and the measurement target 700 or the distance between the measurement target 700 and the upper surface of the stage 200 (for example, the upper surface of the seat portion 201).

Figure 6:
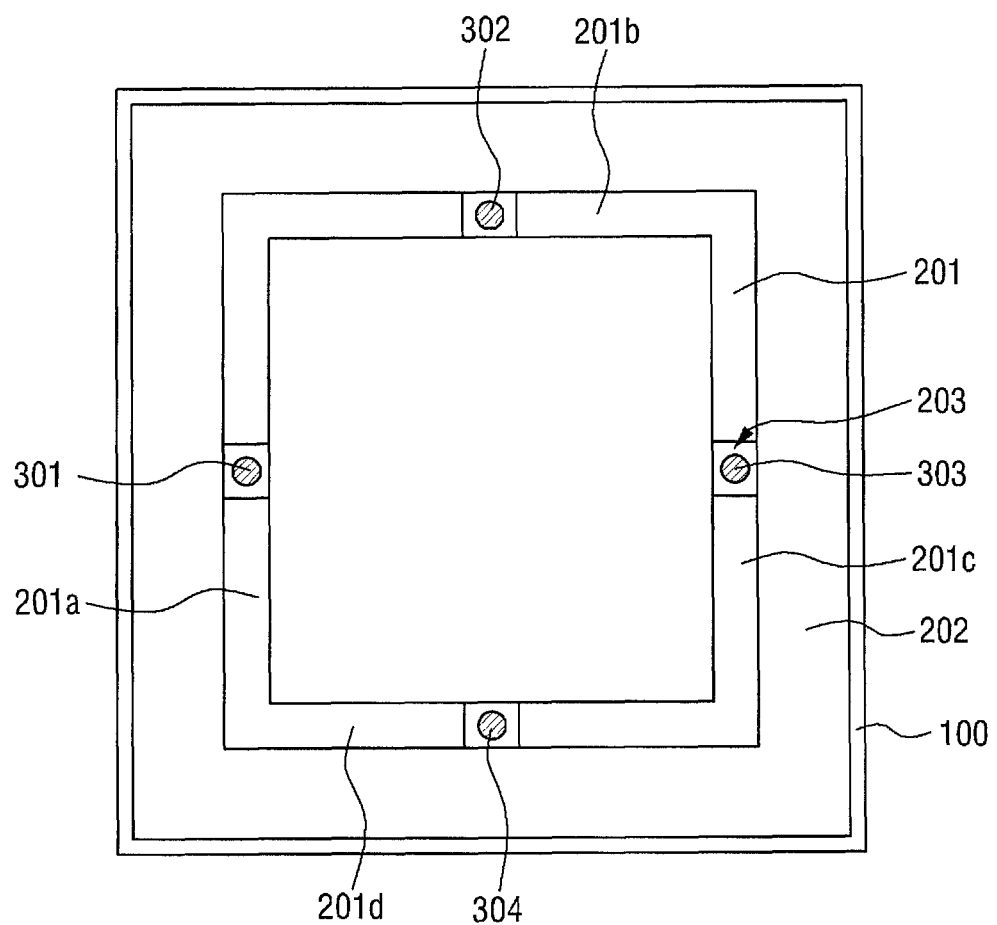
FIG. 6 is a partial plan view of an apparatus for fabricating an organic light emitting display according to another embodiment of the present invention.

FIG. 6 is a partial plan view of an apparatus for fabricating an organic light emitting device according to another embodiment of the present invention.

Referring to FIG. 6, an apparatus 1001 for fabricating an organic light emitting device according to another embodiment of the present invention is different from the apparatus according to the embodiment of FIG. 3, for example, it includes four displacement sensors 300, illustrated as displacement sensors 301-304.

As described above, the apparatus for fabricating an organic light emitting display according to some embodiments of the present invention may include a plurality of displacement sensors 300. FIG. 6 illustrates four displacement sensors 300 (for example, displacement sensors 301-304), but the scope of the present invention is not limited thereto.

For example, a first displacement sensor 301, a second displacement sensor 302, a third displacement sensor 303, and a fourth displacement sensor 304 may be arranged on a first seat portion 201a, a second seat portion 201b, a third seat portion 201c, and a fourth seat portion 201d, respectively.

The respective displacement sensors 301, 302, 303, and 304 may be arranged on center parts of the respective seat portions 201a-d, respectively, but the positions of the respective displacement sensors 301, 302, 303, and 304 are not limited thereto.

In the embodiment where four displacement sensors 301-304 are provided, it can be more accurately determined whether or not the measurement target 700 is stably seated as compared with an embodiment where two displacement sensors are provided. That is, if a plurality of displacement sensors 300 are provided as described above, the controller 500 may output the control signal based on plural pieces of distance information, one piece of distance information measured by a corresponding one of the plurality of displacement sensors 300. For example, if the determination unit 530 of the controller 500 determines that all of the plural pieces of distance information measured by the plurality of displacement sensors 300 are included in or correspond to the reference distance information, the output unit 540 of the controller 500 may output the first control signal. Further, when the determination unit 530 of the controller 500 determines that at least one of the plural pieces of distance information measured by the plurality of displacement sensors 300 is not included in or does not correspond to the reference distance information, the output unit 540 of the controller 500 may output the second control signal. The control signal output from the controller 500 may be received by various driving units, to be further described later, and thus the respective driving units may control the source unit 400, an alarm generation device 800, or a display 900. The details thereof will be described later.

Figure 7:
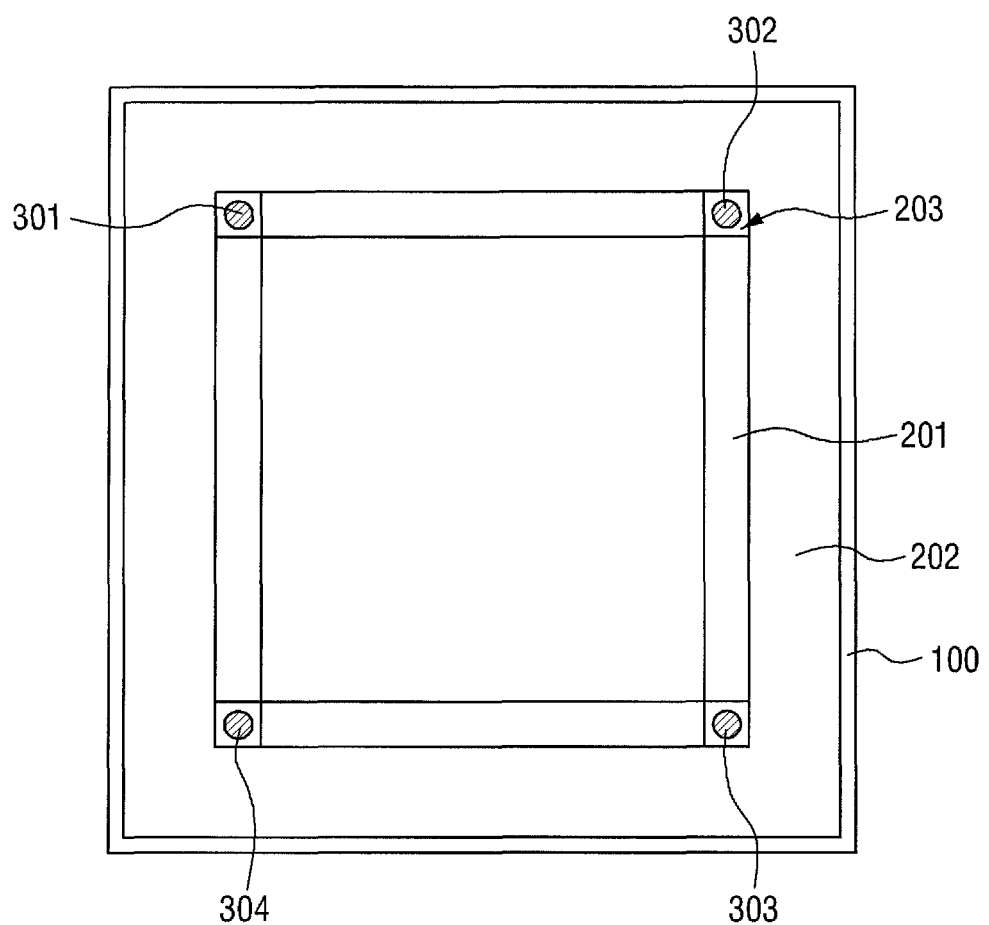
FIG. 7 is a partial plan view of an apparatus for fabricating an organic light emitting display according to another embodiment of the present invention.

FIG. 7 is a partial plan view of an apparatus for fabricating an organic light emitting device according to another embodiment of the present invention.

Referring to FIG. 7, displacement sensors 300 (for example, displacement sensors 301-304) of an apparatus 1002 for fabricating an organic light emitting display according to another embodiment of the present invention are positioned differently from those according to the embodiment of FIG. 6, for example, the displacement sensors 301-304 are arranged at edge parts of the respective seat portions 201a-d.

As described above, the apparatus for fabricating an organic light emitting display according to some embodiments of the present invention may include a plurality of displacement sensors 300. FIG. 7 illustrates four displacement sensors 301-304, but the scope of the present invention is not limited thereto.

For example, a first displacement sensor 301 may be arranged in a region where a first seat portion 201a and a second seat portion 201b meet each other, a second displacement sensor 302 may be arranged in a region where the second seat portion 201b and a third seat portion 201c meet each other, a third displacement sensor 303 may be arranged in a region where the third seat portion 201c and a fourth seat portion 201d meet each other, and a fourth displacement sensor 304 may be arranged in a region where the fourth seat portion 201d and the first seat portion 201a meet each other. That is, in an example embodiment in which the stage 200 has a rectangular hollow portion 204, the plurality of displacement sensors 301, 302, 303, and 304 may be arranged at corner parts of the seat portion 201 formed having a rectangular shape. In the embodiment where the plurality of displacement sensors 300 are arranged at the corners of the seat portion 201, it can be more accurately determined whether or not the corner parts of the measurement target 700, corresponding to the positions of the respective displacement sensors 300, are accurately or stably seated on the stage 200.

Figure 8:
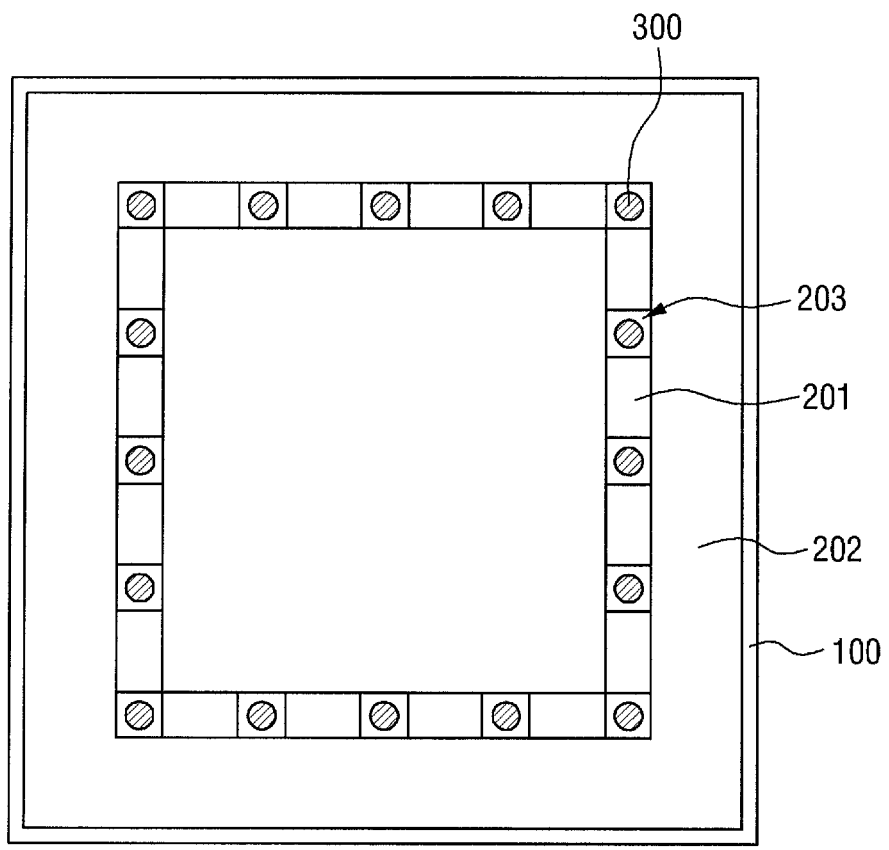
FIG. 8 is a partial plan view of an apparatus for fabricating an organic light emitting display according to another embodiment of the present invention.

FIG. 8 is a partial plan view of an apparatus for fabricating an organic light emitting device according to another embodiment of the present invention.

Referring to FIG. 8, displacement sensors 300 of an apparatus 1003 for fabricating an organic light emitting display according to another embodiment of the present invention are at different positions from those according to the embodiment of FIG. 7, for example, a plurality of displacement sensors 300 are arranged on the respective seat portions 201.

As described above, in the apparatus for fabricating an organic light emitting display according to some embodiments of the present invention, the respective displacement sensors 300 may be arranged on center parts of the respective seat portions 201a, 201b, 201c, and 201d, but the positions of the respective displacement sensors 300 are not limited thereto. FIG. 8 illustrates a plurality of displacement sensors 300 arranged on each of the respective seat portions 201. That is, in addition to the arrangement of the displacement sensors 300 in a region where a first seat portion 201a and a second seat portion 201b overlap each other, in a region where the second seat portion 201b and a third seat portion 201c overlap each other, in a region where the third seat portion 201c and a fourth seat portion 201d overlap each other, and in a region where the fourth seat portion 201d and the first seat portion 201a overlap each other, the displacement sensors 300 may also be at (e.g., installed in) center portions of the respective seat portions 201a, 201b, 201c, and 201d and at regions adjacent to the center portions.

As illustrated in FIG. 8, in the case where a plurality of displacement sensors 300 are arranged on the respective seat portions 201, whether or not the measurement target is seated can be confirmed more precisely through distance measurements of several points of the measurement target 700, each point corresponding to one of the plurality of displacement sensors 300.

Figure 9:
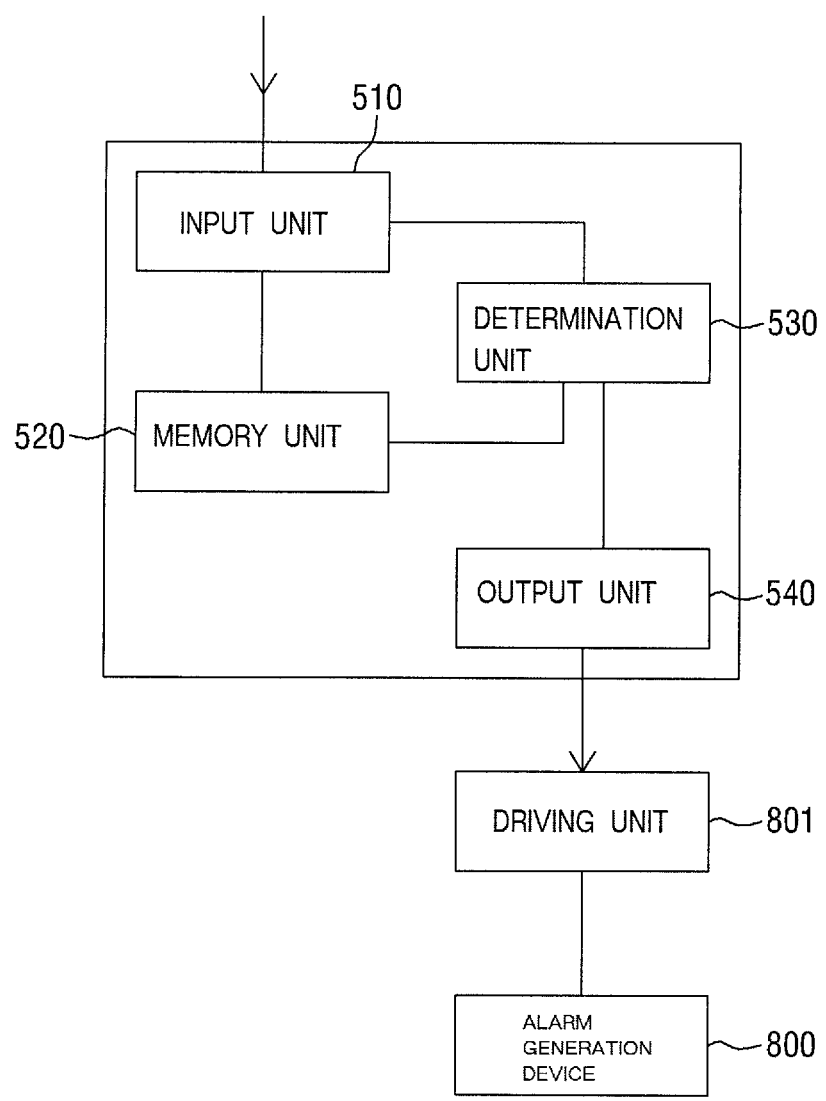
FIG. 9 is a partial block diagram of an apparatus for fabricating an organic light emitting display according to another embodiment of the present invention.

FIG. 9 is a partial block diagram of an apparatus for fabricating an organic light emitting display according to another embodiment of the present invention.

Referring to FIG. 9, the apparatus for fabricating an organic light emitting display device according to another embodiment of the present invention is different from the apparatus according to the embodiment illustrated in FIG. 4, for example, it further includes an alarm generation device 800.

The apparatus for fabricating an organic light emitting display according to another embodiment of the present invention may further include the alarm generation device 800 which receives an input of the control signal from the controller 500 and may generate an alarm. The alarm generation device 800 may be programmed to generate the alarm when a specific control signal is input thereto.

As described above, the displacement sensor 300 may obtain the distance information between the stage 200 and the measurement target 700 that is arranged on or over the stage 200. The distance information between the stage 200 and the measurement target 700 that is arranged on or over the stage 200, which is obtained by the displacement sensor 300, may be inputted into the input unit 510.

The reference distance information may be inputted to the memory unit 520. The reference distance information may be distance information corresponding to a normal range (e.g., optimal range), that is, the distance information that becomes a reference in determining whether or not the measurement target 700 is accurately seated on the stage 200, and may include experimental data. The reference distance information may include a case where the distance between the stage 200 and the measurement target 700 is "0". When the distance between the stage 200 and the measurement target 700 that is arranged on or over the stage 200 is "0", it means that the stage 200 and the measurement target 700 that is arranged on or over the stage 200 are in physical contact with each other, and in this case, the measurement target is stably seated on the stage 200.

The determination unit 530 may compare the distance information between the stage 200 and the measurement target 700 arranged on or over the stage 200, which is received by the input unit 510, with the reference distance information stored in the memory unit 520. That is, the determination unit 530 may determine whether or not the distance between the stage 200 and the measurement target 700 arranged on or over the stage 200, which is received by the input unit 510, is included in or corresponds to the reference distance information stored in the memory unit 520. In other words, as described above, the reference distance information may be the distance information of the normal range (e.g., the optimal range), and the determination unit 530 may determine whether or not the distance between the stage 200 and the measurement target 700 arranged on or over the stage 200, which is obtained by the displacement sensor 300, is included in or corresponds to the normal range. Depending on whether or not the distance information between the stage 200 and the measurement target 700 arranged on or over the stage 200, which is obtained by the displacement sensor 300, is included in or corresponds to the normal range, the output unit 540, to be further described later, may output one of at least two different control signals.

The output unit 540 may output the control signals based on the information determined by the determination unit 530. As described above, the determination unit 530 may compare the reference distance information stored in the memory unit 520 with the distance information between the stage 200 and the measurement target 700 arranged on or over the stage 200, which is received by the input unit 510. In an example embodiment, when the determination unit 530 determines that the distance information between the stage 200 and the measurement target 700 arranged on or over the stage 200, which is received by the input unit 510, is included in or corresponds to the reference distance information, the output unit 540 may output a first control signal, while when the determination unit 530 determines that the distance information between the stage 200 and the measurement target 700 arranged on or over the stage 200, which is received by the input unit 510, deviates from or does not correspond to the reference distance information, the output unit 540 may output a second control signal.

As described above, the apparatus for fabricating an organic light emitting display according to some embodiments of the present invention may include a plurality of displacement sensors 300. If the apparatus for fabricating an organic light emitting display according to some embodiments of the present invention includes the plurality of displacement sensors 300, each of the respective displacement sensors 300 may measure pieces of the distance information corresponding to the position of each of the respective displacement sensors 300 with respect to the measurement target 700. In this case, the distance information between the measurement target 700 and the stage 200, which is obtained by the respective displacement sensors 300, may be received in the input unit 510. In this case, the determination unit 530 may compare the distance information between the measurement target 700 and the stage 200, which is obtained by the respective displacement sensors 300, with the reference distance information. Further, as described above, the output unit 540 may output the control signal based on the information that is determined by the determination unit 530. That is, when the determination unit 530 determines that each of the pieces of the distance information obtained (e.g., measured) by the plurality of displacement sensors 300 is included in or corresponds to the reference distance information, the output unit 540 may output the first control signal. Further, when the determination unit 530 determines that at least one of the pieces of the distance information that is obtained (e.g., measured) by the plurality of displacement sensors 300 deviates from or does not correspond to the reference distance information, the output unit 540 may output the second control signal. However, this is provided as an example, and the control signals output from the output unit 540 are not limited thereto. That is, the controller 500 may be freely programmed so that when at least some of the pieces of the distance information that are obtained by each of the displacement sensors 300 are included in or correspond to the reference distance information, the controller 500 outputs the first control signal, while when less than some of the pieces of the distance information are included in or correspond to the reference distance information, the controller 500 outputs the second control signal.

The first control signal and the second control signal may be received by a driving unit 801 that drives the alarm generation device 800, and the driving unit 801 may drive the alarm generation device 800 according to (e.g., based on) the first control signal or the second control signal. For example, when the driving unit 801 receives the first control signal, the driving unit 801 may maintain (e.g., keep) the state of the alarm generation device 800, when it is stopped, as it is, or may stop the driving of the alarm generation device 800 when it is driven (e.g., when it is generating an alarm). If the driving unit 801 receives the second control signal, the driving unit 801 may drive the alarm generation device 800, when it is stopped, to generate the alarm, or may maintain the driving of the alarm generation device 800 that is driven (e.g., when it is generating the alarm). However, this is provided as an example, and the driving method of the alarm generation device 800 according to the control signal is not limited thereto.

Figure 10:
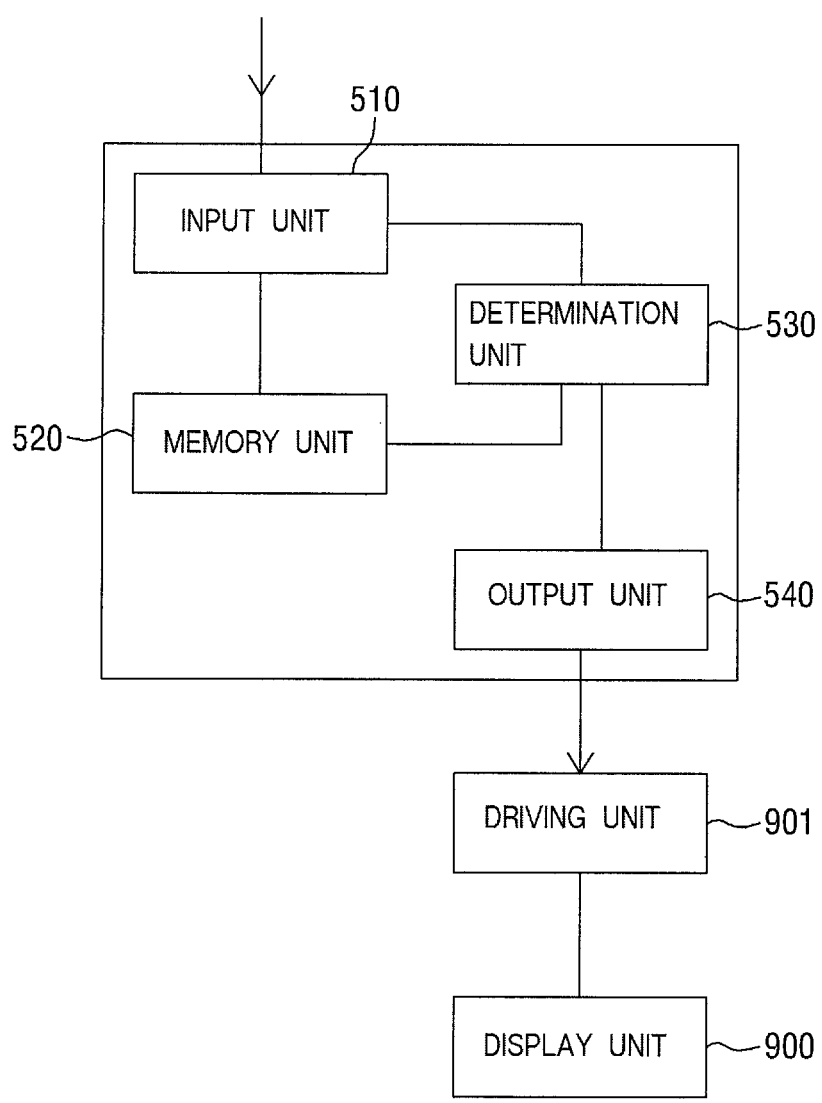
FIG. 10 is a partial block diagram of an apparatus for fabricating an organic light emitting display according to another embodiment of the present invention.

FIG. 10 is a partial block diagram of an apparatus for fabricating an organic light emitting display according to another embodiment of the present invention.

Referring to FIG. 10, the apparatus for fabricating an organic light emitting display according to another embodiment of the present invention is different from the apparatus according to the embodiment of FIG. 4, for example, it includes a display unit 900.

The operation of the controller that receives the distance information from the displacement sensors 300 and outputs the control signal may be substantially the same as that described with reference to FIG. 9, and thus the detailed description thereof may be omitted.

The first control signal and the second control signal may be received by a driving unit 901 that drives the display unit 900, and the driving unit 901 may control the display unit 900 according to (e.g., based on) the first control signal or the second control signal. For example, when the driving unit 901 receives the first control signal, the display unit 900 may display a normal seating state and/or the distance information obtained by the displacement sensors 300. A method for displaying the normal seating state is not limited thereto, and for example, the normal seating state may be displayed using colors or a combination thereof. When the display unit 900 receives the second control signal, the display unit 900 may display an abnormal seating state and/or the distance information obtained by the displacement sensors 300. A method for displaying the abnormal seating state is not limited thereto in the same manner as the method for displaying the normal seating state. For example, the normal seating state may be displayed with green series colors, and the abnormal seating state may be displayed with red series colors. Further, the display unit 900 may display the distance information obtained by the displacement sensors 300 with numeral values. However, the method for displaying the distance information that is obtained by the displacement sensors 300 is not limited thereto, and the distance information obtained by the displacement sensors 300 may be displayed using various kinds of figures or graphs.

As described above, a plurality of displacement sensors 300 may be arranged or provided. When a plurality of displacement sensors 300 are arranged, the display unit 900 may display the distance information obtained by each of the respective displacement sensors 300, and may display a normal/abnormal seating state corresponding to each of the respective displacement sensors 300. However, the above-described driving method is provided as an example, and the driving method of the display unit 900 according to the control signal is not limited thereto.

Figure 11:
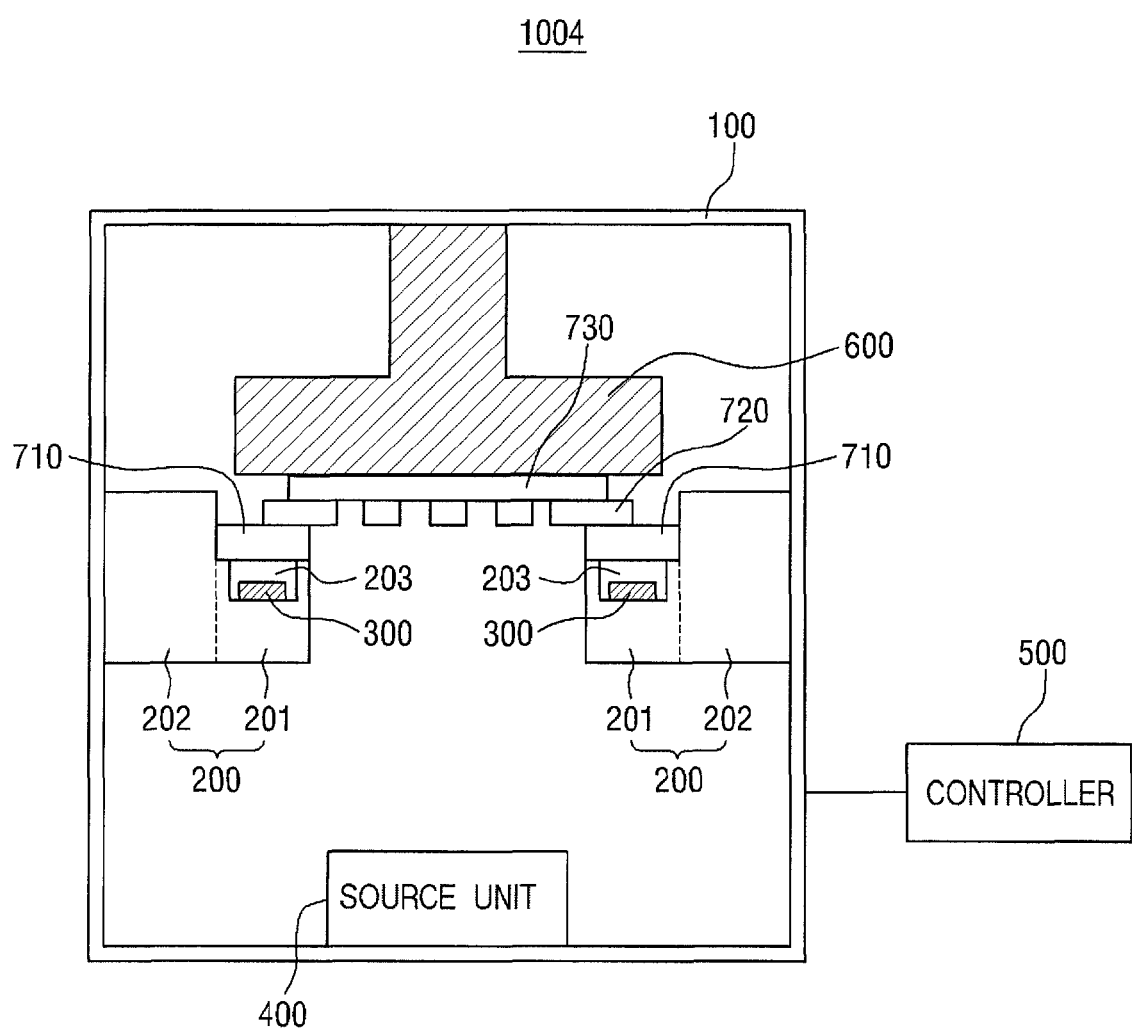
FIG. 11 is a cross-sectional view of an apparatus for fabricating an organic light emitting display according to another embodiment of the present invention.

FIG. 11 is a cross-sectional view of an apparatus for fabricating an organic light emitting display according to another embodiment of the present invention.

Referring to FIG. 11, the organic light emitting display according to this embodiment includes a mask frame 710, coupled to a mask sheet 720, that is arranged as the measurement target 700 arranged on or over the stage 200.

In this embodiment, the chamber 100, the stage 200, the source unit 400, the chuck 600, and the controller 500 are substantially the same as those described above according to the embodiment of FIG. 1, and thus the detailed description thereof may be omitted.

The mask frame 710 may be arranged on or over the stage 200. For example, the mask frame 710 may be arranged on or over the seating portion 201 of the stage 200. In an example embodiment, the mask frame 710 may have a rectangular shape and may have an opening corresponding to the hollow portion 204 of the stage 200. In other words, the mask frame 710 may be formed having a rectangular frame shape. That is, the mask frame 710 may have a rectangular band shape and have a frame aperture (e.g., an opening) formed therein. The mask frame 710 may include a metal material having high strength, for example, stainless steel, but the material of the mask frame 710 is not limited thereto.

The mask frame 710 may be arranged on or over the seat portion 201 of the stage 200. As described above, an accommodation groove 203 for accommodating the displacement sensor 300 may be formed on the seating portion 201, and in this case, the displacement sensor 300 may be located (e.g., interposed) between the seat portion 201 and the mask frame 710 arranged on the seat portion 201.

The displacement sensor 300 may measure the distance between the mask frame 710 that is arranged on or over the upper part of the stage 200. For example, the displacement sensor 300 may measure the distance between the upper surface of the seat portion 201 and the bottom surface of the mask frame 710, but is not limited thereto. In an example embodiment, the distance between the upper surface of the seat portion 201 and the mask frame 710 may be "0" or may be larger than "0". When the distance between the upper surface of the seat portion 201 and the mask frame 710 is "0", it means that the upper surface of the seat portion 201 and the mask frame 710 are in physical contact with each other.

A mask sheet 720 may be arranged on or over the mask frame 710. The mask sheet 720 may include a plurality of slits. The mask sheet 720 that is arranged on or over the mask frame 710 will be further described later.

A substrate 730 may be arranged on or over the mask sheet 720. The substrate 730 may be a material, such as transparent glass, plastic, or silicon, but is not limited thereto. The substrate 730 may be in a state in which no structure or elements are arranged thereon, or in a state in which at least a part of a metal wiring or an insulating layer is arranged thereon. The substrate 730 may be a unit display substrate or a mother substrate before being cut and divided into a plurality of unit display substrate. The substrate 730 may be one sheet of substrate or may include a plurality of stacked substrates.

A chuck 600 may be arranged on or over the substrate 730. The chuck 600 that is arranged on or over the substrate 730 may apply a force to the substrate 730 in a direction opposite to the direction gravity acts. Further, the area (e.g., surface area) of the chuck 600 that faces the substrate 730 may be substantially equal to or larger than the corresponding area (e.g., corresponding surface area) of the substrate 730. That is, the upper part of the substrate 730 may be completely covered by the chuck 600. The chuck 600 is substantially the same as that described above and the detailed description thereof may be omitted.

Figure 12:
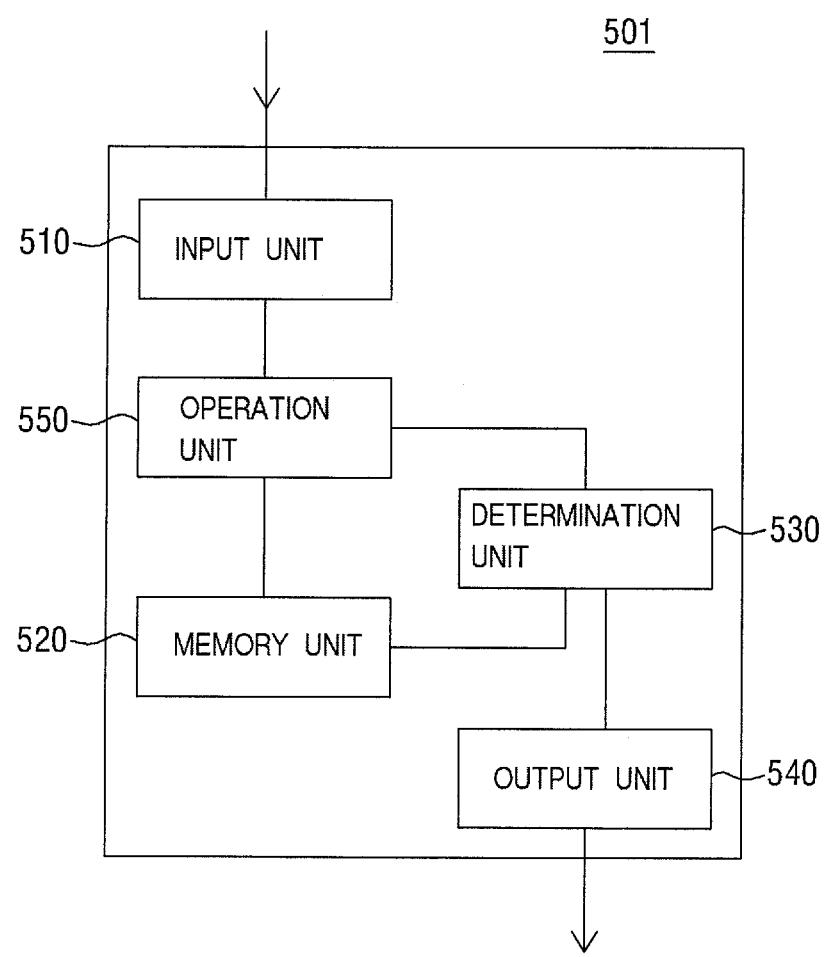
FIG. 12 is a block diagram of a controller of an apparatus for fabricating an organic light emitting display according to the embodiment shown in FIG. 11.

FIG. 12 is a block diagram of a controller of an apparatus for fabricating an organic light emitting device according to the embodiment of FIG. 11.

Referring to FIG. 12, the controller 501 of the apparatus for fabricating an organic light emitting device according to another embodiment of the present invention is different from the apparatus according to the embodiment of FIG. 4, for example, it further includes an operation unit 550.

In an example embodiment in which the mask frame 710, that is coupled to the mask sheet 720, is arranged on or over the stage 200 and the substrate 730 is arranged on or over the mask sheet 720, the controller 501 may further include the operation unit 550. The operation unit 550 may estimate another distance (e.g., a second distance or an estimated second distance) between the stage 200 and the substrate 730 based on the distance information between the mask frame 710 and the stage 200, which is obtained by the displacement sensor 300. For example, the displacement sensor 300 may obtain the distance information between the stage 200 and the mask frame 710 that is arranged on or over the stage 200. The distance information between the stage 200 and the mask frame 710 arranged on or over the stage 200, which is obtained by the displacement sensor 300, may be input to the input unit 510.

The operation unit 550 may estimate the distance between the stage 200 and the substrate 730 based on the distance information between the stage 200 and the mask frame 710 arranged on or over the stage 200, which is obtained by the displacement sensor 300. A method for the operation unit 550 to estimate the distance between the stage 200 and the substrate 730 is described in detail with reference to FIG. 12.

Figure 13:
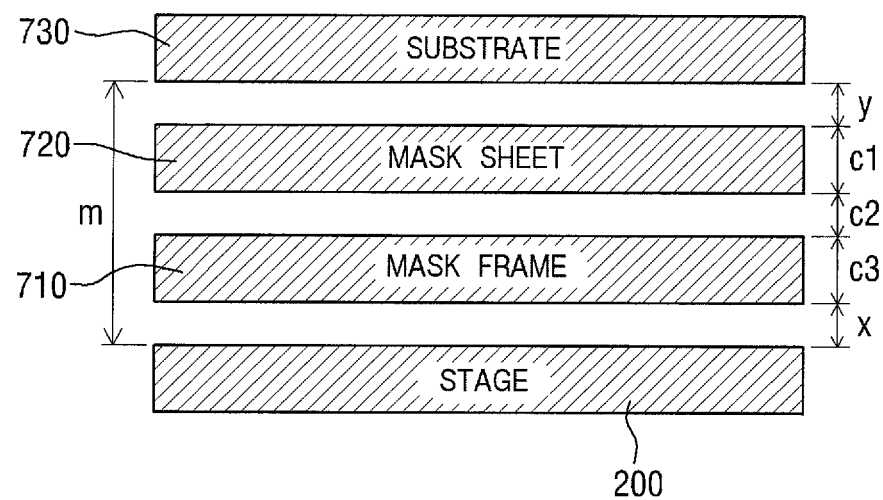
FIG. 13 is a schematic view illustrating relations between a stage, a mask frame, a mask sheet, and a substrate in an apparatus for fabricating an organic light emitting display according to the embodiment shown in FIG. 11.

FIG. 13 is a schematic view illustrating relations between the stage 200, the mask frame 710, the mask sheet 720, and the substrate 730 in an apparatus for fabricating an organic light emitting display according to the embodiment shown in FIG. 11.

Referring to FIG. 13, the stage 200, the mask frame 710, the mask sheet 720, and the substrate 730 may be stacked (e.g., sequentially stacked).

The stage 200, as illustrated in FIG. 13, may include the seat portion 201. The operation unit 550 may measure or estimate the distance between the substrate 730 and the stage 200. For example, the distance m between the upper surface of the seat portion 201 of the stage 200 and the bottom surface of the substrate 730 may be measured. As described above, the displacement sensor 300 arranged on the stage 200 may measure the distance x between the stage 200 and the mask frame 710. The thickness c3 of the mask frame 710 and the thickness c1 of the mask sheet 720 may be constants (e.g., fixed constants), and the thickness c3 of the mask frame 710 and the thickness c1 of the mask sheet 720 may be inputted to and stored in the memory unit 520. Further, the mask frame 710 and the mask sheet 720 are coupled to each other, and the distance c2 between the mask frame 710 and the mask sheet 720 may be a constant (e.g., fixed constant) or "0". The fixed distance value between the mask frame 710 and the mask sheet 720 may also be inputted to and stored in the memory unit 520. The distance y between the mask sheet 720 and the substrate 730 may be "0", a constant (e.g., fixed constant), or a value derived by a "function with respect to x". The "function with respect to x" may be obtained through experimental data, but is not limited thereto. The "function with respect to x" to obtain the y-value or the y-value may be inputted to and stored in the memory unit 520.

The operation unit 550 may measure, estimate, or calculate the distance between the stage 200 and the substrate 730, for example, the distance between the upper surface of the seat portion 201 of the stage 200 and the bottom surface of the substrate 730, based on the above-described information. That is, the distance m between the upper surface of the seat portion 201 of the stage 200 and the bottom surface of the substrate 730 may be measured or calculated through addition of the distances between the stage 200 and the mask frame 710, which is measured by the displacement sensor 300, one or more constants stored in the memory unit 520, and the distance y between the mask sheet 720 and the substrate 730, which may be "0" or may be derived from the distance x between the stage 200 and the mask frame 710.

As described above, the reference distance information may be inputted to the memory unit 520. In the apparatus for fabricating an organic light emitting device according to another embodiment of the present invention, the reference distance information is distance information between the stage 200 and the substrate 730. The reference distance information may be distance information in a state where the mask frame 710 is normally seated on the stage 200, and may include distance information of a value (e.g., a predetermined value) or in a range (e.g., a predetermined range). Further, the reference distance information may include experimental data.

The determination unit 530 may compare the distance information between the stage 200 and the substrate 730, which is estimated or calculated by the operation unit 550, with the reference distance information stored in the memory unit 520. That is, the determination unit 530 may determine whether or not the distance information between the stage 200 and the substrate 730, which is estimated or calculated by the operation unit 550, is included in or corresponds to the reference distance information stored in the memory unit 520. In other words, as described above, the reference distance information may include the distance information of a range (e.g., a predetermined range), and the determination unit 530 may determine whether or not the distance between the stage 200 and the substrate 730, which is estimated or calculated by the operation unit 550, is included in or corresponds to the range (e.g., the predetermined range). Depending on whether or not the distance information between the stage 200 and the substrate 730, which is estimated or calculated by the operation unit 550, is included in or corresponds to the reference distance information, the output unit 540 may output one of at least two different control signals.

The output unit 540 may output the control signals based on the information determined by the determination unit 530. As described above, the determination unit 530 may compare the reference distance information stored in the memory unit 520 with the distance information between the stage 200 and the substrate 730, which is estimated or calculated by the operation unit 550. In an example embodiment, when the determination unit 530 determines that the distance information between the stage 200 and the substrate 730, which is estimated or calculated by the operation unit 550, is included in or corresponds to the reference distance information, the output unit 540 may output a first control signal, while when the determination unit 530 determines that the distance information between the stage 200 and the substrate 730, which is estimated or calculated by the operation unit 550, deviates from or does not correspond to the reference distance information, the output unit 540 may output a second control signal.

The first control signal and the second control signal may be received by the driving unit that drives any one of the source unit 400, the display unit 900, and the alarm generation device 800. Because the method for the driving unit that receives the control signal to drive any one of the source unit 400, the display unit 900, and the alarm generation device 800 may be substantially the same as the method as described above, the detailed description thereof may be omitted.

Figure 14:
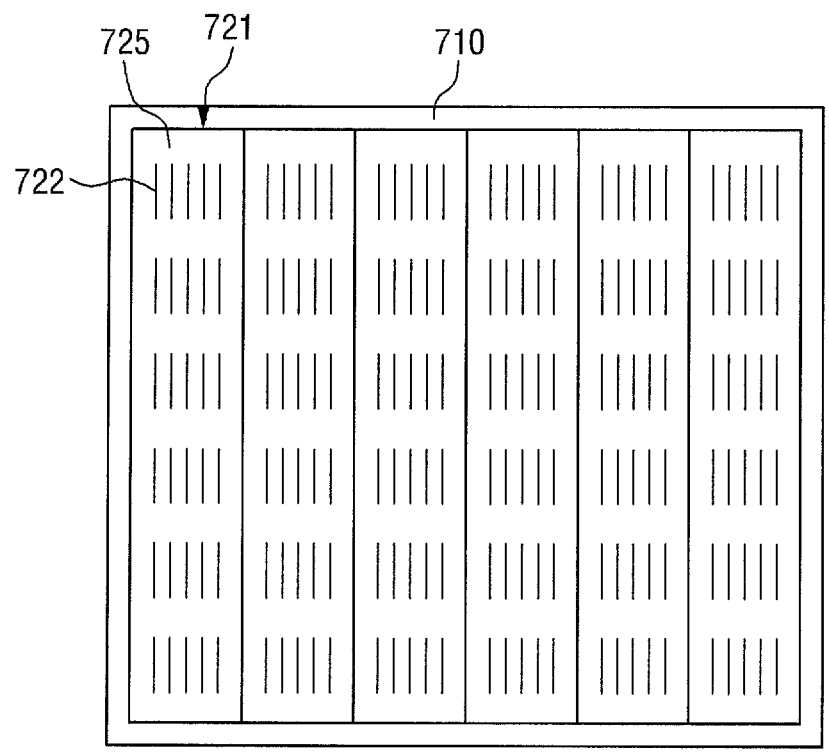
FIG. 14 is a plan view illustrating a mask frame arranged on a stage and a mask sheet coupled to the mask frame in an apparatus for fabricating an organic light emitting display according to another embodiment of the present invention.

FIG. 14 is a plan view illustrating a mask frame 710 arranged on or over a stage 200 and a mask sheet 721 coupled to the mask frame 710 in an apparatus for fabricating an organic light emitting display according to another embodiment of the present invention.

Referring to FIG. 14, the mask sheet 721 may include a plurality of individual (e.g., divided) masks 725.

The plurality of masks 725 may be arranged on the mask frame 710 to cover the opening in the mask frame 710. For example, two ends of each of the divided masks 725 may be fixed to the mask frame 710 by welding. However, the fixing method of the divided masks 725 is not limited thereto.

Each of the divided masks 725 may include a plurality of pattern apertures 722. The plurality of pattern apertures 722 may be positioned in a line and spaced apart (e.g., spaced apart by a predetermined distance) from each other along a first direction. In an example embodiment, each of the pattern apertures 722 may be formed in a shape corresponding to a thin-film shape to be deposited on the substrate 730 that is arranged on the mask sheet 725. Accordingly, in a deposition process, a deposition material is deposited on the substrate 730 through the pattern apertures 722, and thus a thin-film of a desired shape, for example, an organic light emitting layer or a metal layer may be formed.

Figure 15:
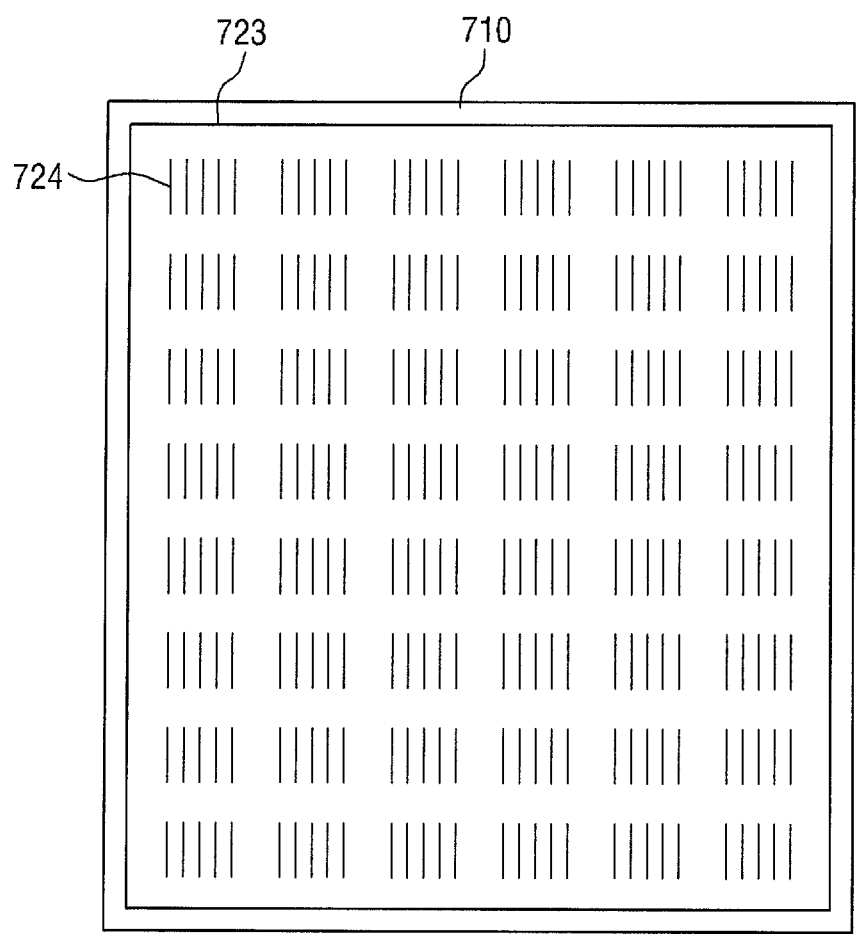
FIG. 15 is a plan view illustrating a mask frame arranged on a stage and a mask sheet coupled to the mask frame in an apparatus for fabricating an organic light emitting display according to another embodiment of the present invention.

FIG. 15 is a plan view illustrating a mask frame 710 arranged on a stage 200 and a mask sheet 723 coupled to the mask frame 710 in an apparatus for fabricating an organic light emitting display according to another embodiment of the present invention.

Referring to FIG. 15, the mask sheet 723 according to another embodiment of the present invention may be a single mask.

The mask sheet 723 may be arranged on the mask frame 710 to cover the opening of the mask frame 710, at least partially. For example, a side part of the mask sheet 723 may be fixed to the mask frame 710 by welding. However, the fixing method of the mask sheet 723 is not limited thereto.

The mask sheet 723 may include a plurality of pattern apertures 724. The plurality of pattern apertures 724 may be positioned in a line and spaced apart (e.g., spaced apart by a predetermined distance) from each other along the first direction. In an example embodiment, each of the pattern apertures 724 may be formed in a shape corresponding to a thin-film shape to be deposited on the substrate 730 that is arranged on the mask sheet 723. Accordingly, in a deposition process, a deposition material is deposited on the substrate 730 through the pattern apertures 724, and thus a thin-film of a desired shape, for example, an organic light emitting layer or a metal layer, may be formed.

The mask sheet of FIGS. 14 and 15 may be a fine metal mask. However, the kind or type of the mask sheet is not limited thereto, and various kinds or types of mask sheets may be arranged on the mask frame.

Figure 16:
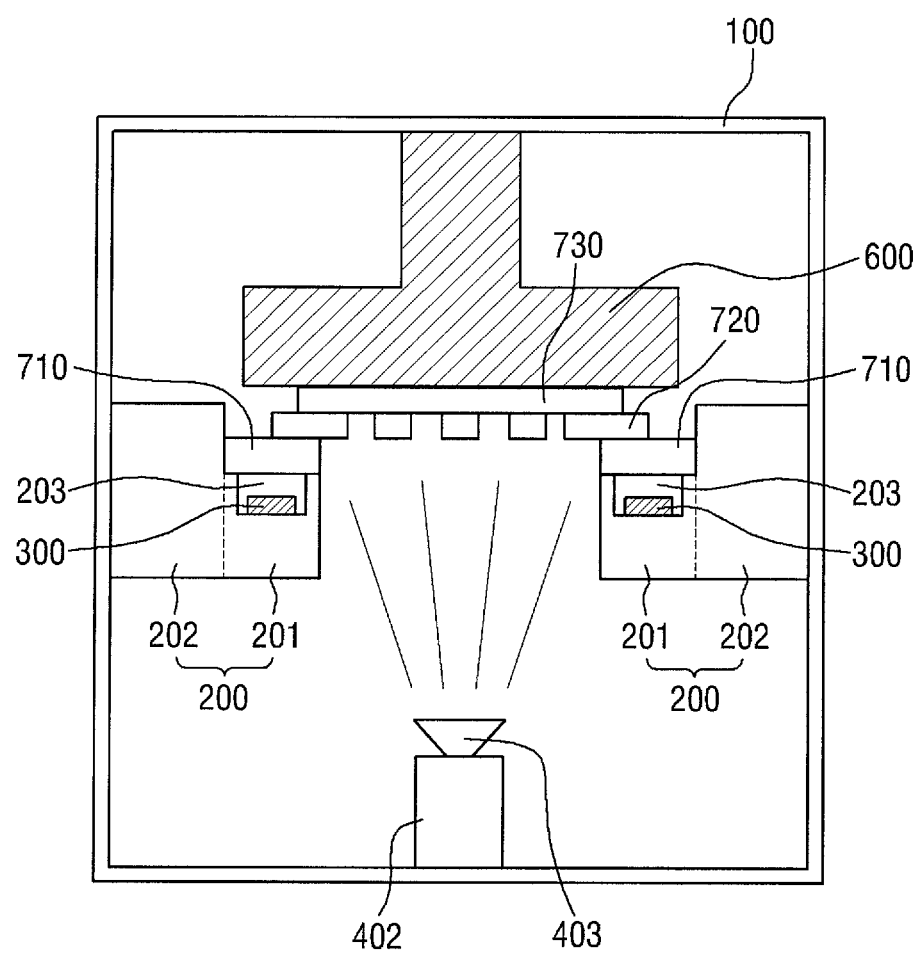
FIG. 16 is a cross-sectional view of an apparatus for fabricating an organic light emitting display according to another embodiment of the present invention.

FIG. 16 is a cross-sectional view of an apparatus for fabricating an organic light emitting display according to another embodiment of the present invention.

Referring to FIG. 16, unlike the embodiment of FIG. 1, the source unit 400 according to this embodiment includes a furnace 403 that provides a deposition material and a heater 402 that heats the furnace 403.

As described above, the source unit 400 may include a deposition source that provides a deposition material for forming a thin-film on the substrate 730 that is arranged on or over the stage 200. For example, the deposition source may include the furnace 403 that stores the deposition material and the heater 402 that heats the furnace 403.

When the heater 402 heats the furnace 403, the deposition material stored in the furnace 403 is heated to be evaporated. The evaporated deposition material may be deposited on the substrate 730 after passing through the mask frame 710 arranged on or over the stage 200 and the plurality of aperture patterns arranged on the mask sheet 720. As described above, each of the pattern apertures may be formed in a shape corresponding to the shape of a thin film to be deposited on the substrate 730 that is arranged on the mask sheet 720, and the deposition material, which has passed through the plurality of aperture patterns, may be deposited on the substrate 730 to form the thin film having a shape corresponding to the shape of the aperture pattern, for example, an organic layer or a metal layer.

Hereinafter, a method for fabricating an organic light emitting display according to an embodiment of the present invention will be described. For detailed description thereof, drawings as described above may be referred to. The same reference numerals are used for elements that are substantially the same as the elements as described above, and the duplicate description of substantially the same elements may be omitted.

Figure 17:
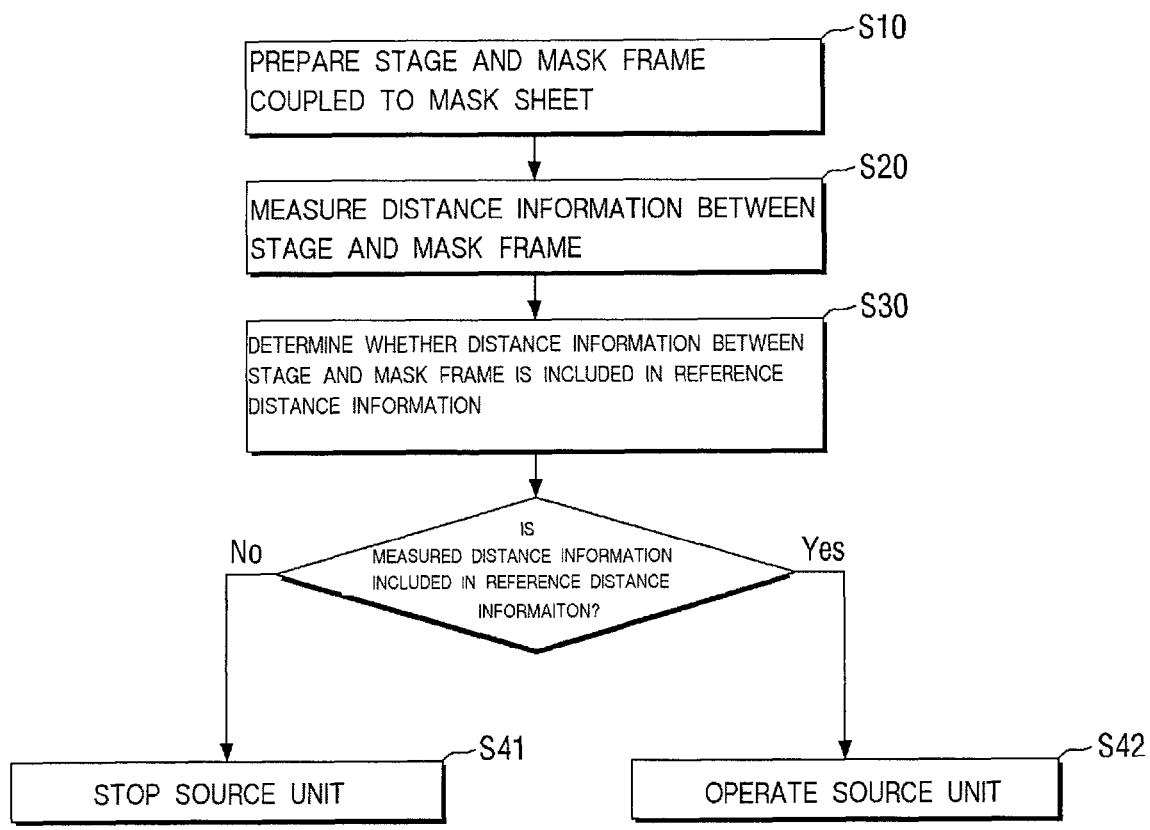
FIG. 17 is a flowchart of a method for fabricating an organic light emitting display according to an embodiment of the present invention.

FIG. 17 is a flowchart of a method for fabricating an organic light emitting display according to an embodiment of the present invention.

Referring to FIG. 17, a method for fabricating an organic light emitting display according to an embodiment of the present invention includes preparing a stage 200 having a hollow portion 204 and a mask frame 710 arranged on or over the stage 200 and coupled to a mask sheet 720 (S10), obtaining distance information (e.g., a distance or a first distance) between the stage 200 and the mask frame 710 (S20), determining whether or not the obtained distance information (e.g., the measured distance or the obtained first distance) is included in or corresponds to reference distance information (e.g., a reference distance or pre-input reference distance information) (S30), and controlling a source unit 400 arranged at a bottom part of the chamber 100 to provide a thin-film forming material toward the stage 200 (S40).

The method for fabricating an organic light emitting device according to an embodiment of the present invention may be performed by the apparatus for fabricating an organic light emitting display according to some embodiments of the present invention as described above, but is not limited thereto.

First, a stage 200 having a hollow portion 204 and a mask frame 710 arranged on or over the stage 200 and coupled to a mask sheet 720 are prepared (810). A substrate 730 may be arranged on or over the mask frame 710.

Then, distance information between the stage 200 and the mask frame 710 is obtained (S20). The obtaining the distance information between the stage 200 and the mask frame 710 (S20) may include the displacement sensor arranged on the stage 200 measuring the distance between the stage 200 and the mask frame 710.

Then, it is determined whether or not the obtained distance information between the stage 200 and the mask frame 710 is included in or corresponds to the reference distance information (S30). The determining whether or not the obtained distance information between the stage 200 and the mask frame 710 is included in or corresponds to the reference distance information may be performed by a controller 500 that includes an input unit 510 receiving the distance information between the stage 200 and the mask frame 710, which is obtained by the displacement sensor 300, a memory unit 520 storing the reference distance information (e.g., predetermined reference distance information), and a determination unit 530 determining whether or not the obtained distance information between the stage 200 and the mask frame 710 is included in or corresponds to the reference distance information. The controller 500 may further include an output unit 540 outputting control signals corresponding to (e.g., based on) the information determined by the determination unit 530. The output unit 540 may output the control signal according to the information determined by the determination unit 530. For example, when the determination unit 530 determines that the distance information between the stage 200 and the mask frame 710 arranged on or over the stage 200, which the input unit 510 receives, is included in or corresponds to the reference distance information, the output unit 540 outputs the first control signal, while when the determination unit 530 determines that the distance information between the stage 200 and the mask frame 710 arranged on or over the stage 200, which the input unit 510 receives, deviates from or does not correspond to the reference distance information, the output unit 540 outputs the second control signal.

Because the controller 500 is substantially the same as that described above in the apparatus for fabricating an organic light emitting device according to some embodiments of the present invention, the detailed description thereof may be omitted.

Then, the source unit 400 that is arranged on a bottom part of the chamber 100 and provides a thin-film forming material toward the stage 200 is controlled (S40). The controlling the source unit 400 arranged at the bottom part of the chamber 100 to provide the thin-film forming material toward the stage 200 (S40) may include stopping the source unit 400 (841) and operating the source unit 400 (842).

In an example embodiment in which the output unit 540 outputs the control signal, the controlling the source unit 400 that provides the thin-film forming material toward the stage 200 (S40) may include the driving unit 401 included in the source unit 400 driving the source unit 400 to receive the control signals, and operating the source unit 400 or stopping the source unit 400 according to the control signal. "Operating the source unit 400" may mean that the source unit 400 provides the thin-film forming material toward the substrate 730 arranged on the mask sheet 720.

For example, when the driving unit 401 receives the first control signal, the driving unit 401 may operate the source unit 400, and when the driving unit 401 receives the second control signal, the driving unit 401 may stop the source unit 400. However, this is provided as an example, and the driving method of the driving unit is not limited thereto.

As described above, the source unit 400 may include the furnace 403 that stores the deposition material and the heater 402 that heats the furnace 403, and the controlling the source unit 400 that provides the thin-film forming material toward the stage 200 (S40) may include heating the furnace 403 and depositing the heated deposition material onto the substrate 730 that is arranged on the mask sheet 720.

For convenience of explanation, it is explained that the controlling the source unit 400 that provides the thin-film forming material toward the stage 200 (S40) is performed after the obtaining the distance information between the stage 200 and the mask frame 710 (S20) and the determining whether or not the obtained distance information is included in or corresponds to the reference distance information (S30). However, the method for fabricating an organic light emitting display according to an embodiment of the present invention is not limited to the above-described order. That is, the obtaining the distance information between the stage 200 and the mask frame 710 (S20) and the determining whether or not the obtained distance information is included in or corresponds to the reference distance information (e.g., pre-input reference distance information) (S30) may be continuously performed not only before the controlling the source unit 400 that provides the thin-film forming material toward the stage 200 (S40) is performed but also while the controlling the source unit 400 that provides the thin-film forming material toward the stage 200 (S40) is performed. In other words, the obtaining the distance information between the stage 200 and the mask frame 710 (S20) and the determining whether or not the obtained distance information is included in or corresponds to the reference distance information (S30) may be performed in real-time throughout the whole thin-film forming process, and when it is determined that the obtained distance information deviates from or does not correspond to the reference distance information at any time during the process, the source unit 400 that provides the thin-film forming material toward the stage 200 may be stopped, while when it is determined that the obtained distance information is included in or corresponds to the reference distance information, the source unit 400, when it is in a stopped state, may be operated.

Hereinafter, a method for fabricating an organic light emitting display according to another embodiment of the present invention will be described.

Figure 18:
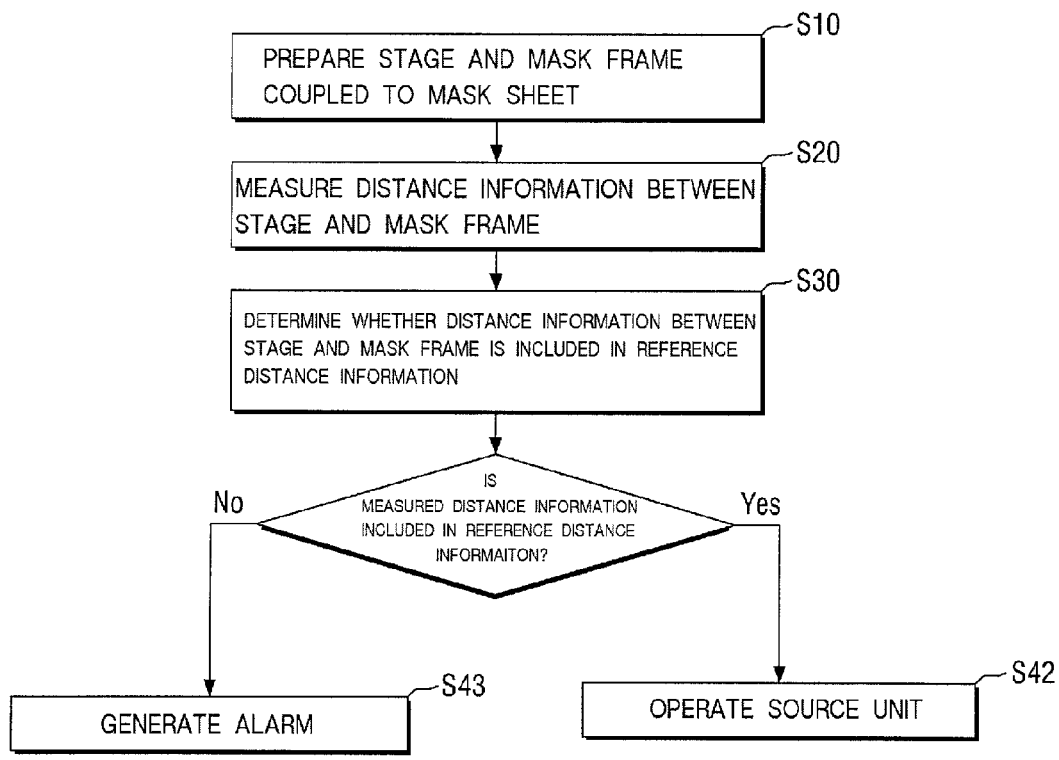
FIG. 18 is a flowchart of a method for fabricating an organic light emitting display according to another embodiment of the present invention.

FIG. 18 is a flowchart of a method for fabricating an organic light emitting display according to another embodiment of the present invention.

Referring to FIG. 18, the method for fabricating an organic light emitting display according to another embodiment of the present invention is different from the method according to the embodiment of FIG. 17. For example, the method according to another embodiment of the present invention further includes generating an alarm when the obtained distance information between the stage 200 and the mask frame 710 deviates from or does not correspond to the reference distance information (S43). As described above, the obtaining the distance information between the stage 200 and the mask frame 710 (S20) and the determining whether or not the obtained distance information is included in or corresponds to the reference distance information (e.g., pre-input reference distance information) (S30) may be performed continuously and/or repeatedly not only before the controlling the source unit 400 that provides the thin-film forming material toward the stage 200 (S40) is performed but also while the controlling the source unit 400 that provides the thin-film forming material toward the stage 200 (S40) is performed. Accordingly, the generating an alarm when the obtained distance information between the stage 200 and the mask frame 710 deviates from or does not correspond to the reference distance information (S43) may be performed not only before the controlling the source unit 400 that provides the thin-film forming material toward the stage 200 (S40) is performed but also while the controlling the source unit 400 that provides the thin-film forming material toward the stage 200 (840) is performed.

The distance between the stage 200 and the mask frame 710 may deviate from or not correspond to the reference distance information due to several causes during the process, and in this case, the alarm generation device 800 may generate an alarm or alarms to notify a worker that the distance between the stage 200 and the mask frame 710 deviates from or does not correspond to the reference distance information. Through this, if the seating abnormality occurs before or during the process, the worker can recognize the abnormality using the alarm and promptly take corresponding measures to prevent the occurrence of the product inferiority or product defect.

Figure 19:
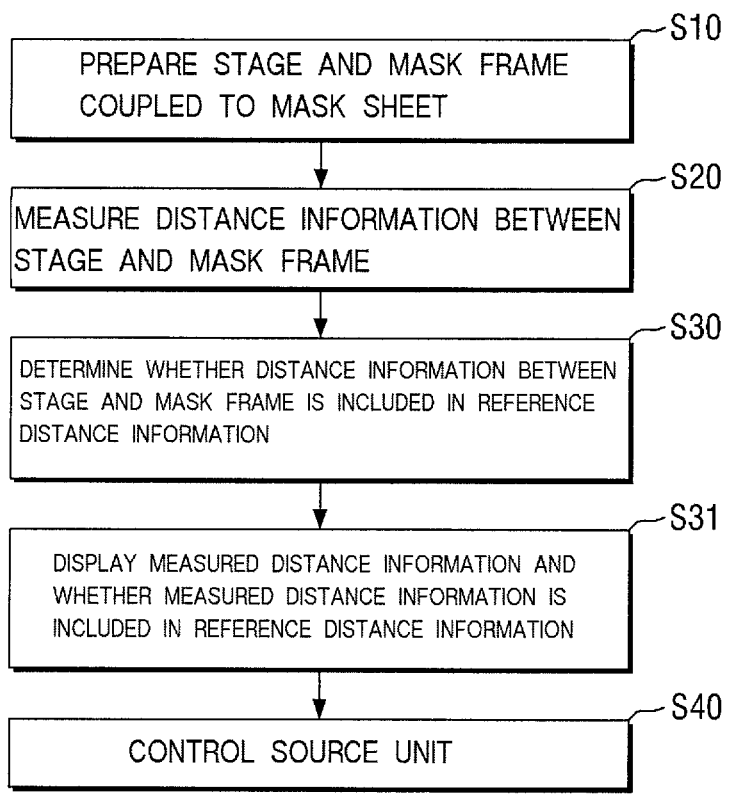
FIG. 19 is a flowchart of a method for fabricating an organic light emitting display according to another embodiment of the present invention.

FIG. 19 is a flowchart of a method for fabricating an organic light emitting display according to another embodiment of the present invention.

Referring to FIG. 19, the method for fabricating an organic light emitting display according to another embodiment of the present invention is different from the method according to the embodiment of FIG. 16. For example, the method according to another embodiment of the present invention further includes displaying the obtained distance information and whether or not the obtained distance information is included in or corresponds to the reference distance information on the display unit 900 (S31).

As described above, the obtaining the distance information between the stage 200 and the mask frame 710 (S20) and the determining whether or not the obtained distance information is included in or corresponds to the reference distance information (e.g., pre-input reference distance information) (S30) may be performed continuously and/or repeatedly not only before the providing the thin-film forming material toward the stage 200 (S40) is performed, but also while the providing the thin-film forming material toward the stage 200 (S40) is performed. Accordingly, the displaying the obtained distance information and whether or not the obtained distance information is included in or corresponds to the reference distance information on the display unit 900 (S31) may be performed in real-time throughout the process. The distance between the stage 200 and the mask frame 710 may deviate from or not correspond to the reference distance information due to several causes during the process, and in this case, the alarm generation device 800 may generate an alarm to notify a worker that the distance between the stage 200 and the mask deviates from or does not correspond to the reference distance information. Through this, when the seating abnormality occurs before or during the process, the worker can recognize the abnormality occurrence using the alarm, and promptly take the corresponding measures to prevent the occurrence of the product inferiority (e.g., product defect).

Figure 20:
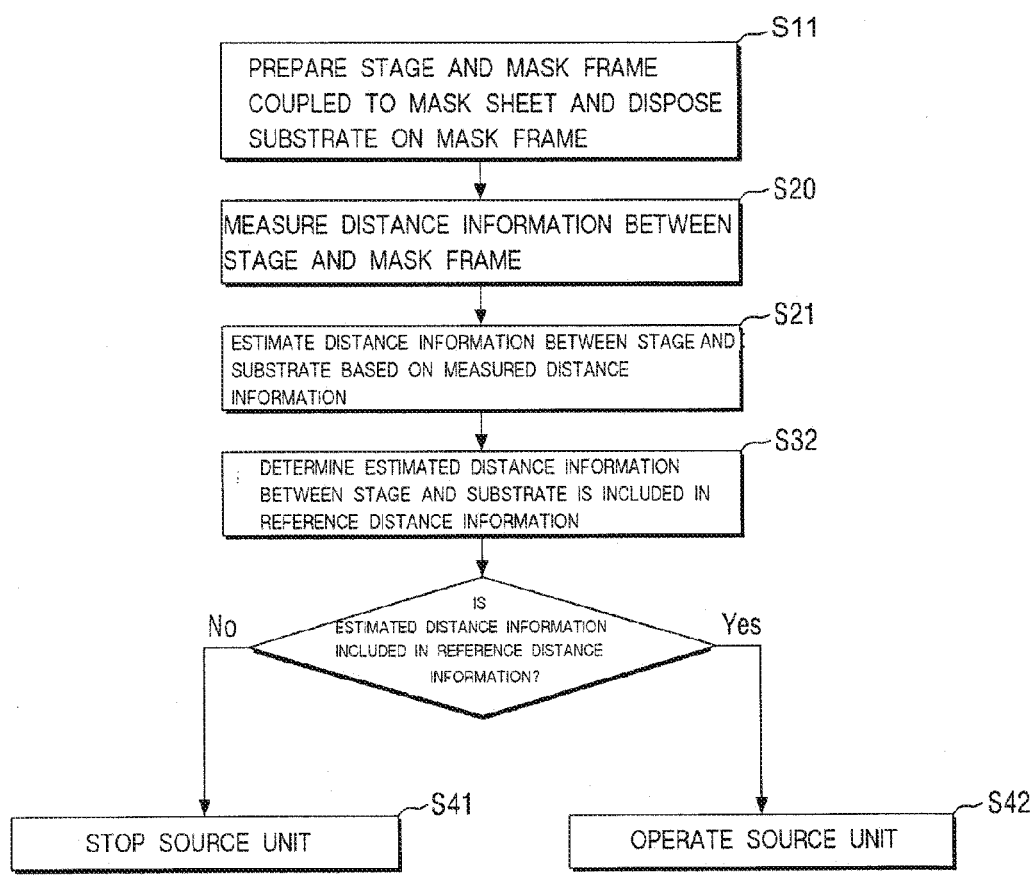
FIG. 20 is a flowchart of a method for fabricating an organic light emitting display according to another embodiment of the present invention.

FIG. 20 is a flowchart of a method for fabricating an organic light emitting display according to another embodiment of the present invention.

Referring to FIG. 20, a method for fabricating an organic light emitting device according to another embodiment of the present invention includes preparing a stage 200 having a hollow portion 204 and a mask frame 710 arranged on or over the stage 200 and coupled to a mask sheet 720, and arranging a substrate 730 on the mask sheet 720 (S11), obtaining distance information between the stage 200 and the mask frame 710 (S20), estimating or determining a distance between the stage 200 and the substrate 730 based on the obtained distance information between the stage 200 and the mask frame 710 (e.g., a second distance) (S21), determining whether or not the estimated distance information between the stage 200 and the substrate 730 (e.g., the estimated second distance) is included in or corresponds to the reference distance information (S32), and controlling a source unit 400 arranged on a bottom part of the chamber 100 to provide a thin-film forming material toward the stage 200 (S40).

First, the stage 200 having the hollow portion 204 and the mask frame 710 arranged on or over the stage 200 and coupled to the mask sheet 720 are prepared, and the substrate 730 is arranged on the mask sheet 720 (S11).

Then, the distance information between the stage 200 and the mask frame 710 is obtained (S20). The obtaining the distance information between the stage 200 and the mask frame 710 (S20) may include the displacement sensor 300 arranged on the stage 200 measuring the distance between the stage 200 and the mask frame 710.

Then, the distance between the substrate 730 and the stage 200 is estimated or calculated based on the obtained distance information between the stage 200 and the mask frame 710 (S21). Because the estimating or determining the distance between the substrate 730 and the stage 200 is substantially the same as that as described above according to the embodiment of FIG. 12, the detailed description thereof may be omitted.

Then, it is determined whether or not the estimated distance between the stage 200 and the substrate 730 is included in or corresponds to the reference distance information (S32).

The estimating the distance between the stage 200 and the substrate 730 based on the obtained distance information between the stage 200 and the mask frame 710 (S21) and the determining whether or not the estimated distance between the stage 200 and the substrate 730 is included in or corresponds to the reference distance information (S32) may be performed by a controller 501 that includes an input unit 510 receiving the distance information between the stage 200 and the mask frame 710, which is obtained by the displacement sensor 300, an operation unit 550 estimating or determining the distance information between the stage 200 and the substrate 730 based on the distance information between the stage 200 and the mask frame 710, which is obtained by the displacement sensor 300, a memory unit 520 storing the reference distance information (e.g., the predetermined reference distance information), and a determination unit 530 determining whether or not the distance information between the stage 200 and the substrate 730, which is estimated or calculated by the operation unit 550, is included in or corresponds to the reference distance information. The controller 500 may further include an output unit 540 outputting control signals based on the information determined by the determination unit 530. The output unit 540 may output the control signal based on the information determined by the determination unit 530.

For example, when the determination unit 530 determines that the distance information between the stage 200 and the substrate 730 arranged on or over the stage 200, which is estimated or calculated by the operation unit 550, is included in or corresponds to the reference distance information, the output unit 540 outputs the first control signal, while when the determination unit 530 determines that the distance information between the stage 200 and the substrate 730 arranged on or over the stage 200, which is estimated or calculated by the operation unit 550, deviates from or does not correspond to the reference distance information, the output unit 540 outputs the second control signal.

Because the controller 500 is substantially the same as that described above in the apparatus for fabricating an organic light emitting device according to some embodiments of the present invention as described above, the detailed description thereof may be omitted.

Then, the source unit 400 that is arranged at a bottom part of the chamber 100 and provides a thin-film forming material toward the stage 200 is controlled (S40). The controlling the source unit 400 arranged at the bottom part of the chamber 100 to provide the thin-film forming material toward the stage 200 (S40) may include the driving unit 401 included in the source unit 400 driving the source unit 400 to receive the control signals, and operating or stopping the source unit 400 based on the control signals. "Operating the source unit 400" may mean that the source unit 400 provides the thin-film forming material toward the substrate 730 arranged on the mask sheet 720.

For example, when the driving unit 401 receives the first control signal, the driving unit 401 may operate the source unit 400, and when the driving unit 401 receives the second control signal, the driving unit 401 may stop the source unit 400. However, this is provided as an example, and the driving method of the driving unit is not limited thereto.

As described above, the source unit 400 may include the furnace 403 that stores the deposition material and the heater 402 that heats the furnace 403, and the controlling the source unit 400 that provides the thin-film forming material toward the stage 200 (S40) may include heating the furnace 403 and depositing the heated deposition material onto the substrate 730 that is arranged on the mask sheet 720.

For convenience of explanation, it is explained that the controlling the source unit 400 that provides the thin-film forming material toward the stage 200 (S40) is performed after the obtaining the distance information between the stage 200 and the mask frame 710 (S20), the estimating or calculating the distance between the substrate 730 and the stage 200 based on the obtained distance information between the stage 200 and the mask frame 710 (S21), and the determining whether or not the estimated distance between the stage 200 and the substrate 730 is included in or corresponds to the reference distance information (S32). However, the method for fabricating an organic light emitting display according to another embodiment of the present invention is not limited to the above-described order. That is, the obtaining the distance information between the stage 200 and the mask frame 710, the estimating or calculating the distance between the substrate 730 and the stage 200 based on the obtained distance information between the stage 200 and the mask frame 710, and the determining whether or not the estimated distance between the stage 200 and the substrate 730 is included in or corresponds to the reference distance information may be continuously and/or repeatedly performed not only before the providing the thin-film forming material toward the stage 200 (S40) is performed but also while the providing the thin-film forming material toward the stage 200 (S40) is performed. In other words, the obtaining the distance information between the stage 200 and the mask frame 710, the estimating or calculating the distance between the substrate 730 and the stage 200 based on the obtained distance information between the stage 200 and the mask frame 710, and the determining whether or not the estimated distance between the stage 200 and the substrate 730 is included in or corresponds to the reference distance information may be performed in real-time throughout the whole thin-film forming process, and when it is determined that the estimated distance information deviates from or does not correspond to the reference distance information during the process, the source unit 400 that provides the thin-film forming material toward the stage 200 may be stopped, while when it is determined that the estimated distance information is included in or corresponds to the reference distance information, the source unit 400 that is in a stopped state may be operated.

Although embodiments of the present invention have been described for illustrative purposes, those skilled in the art will appreciate that various modifications, additions and substitutions are possible, without departing from the scope and spirit of the invention as disclosed in the accompanying claims and their equivalents.

While the present invention has been particularly shown and described with reference to example embodiments thereof, it will be understood by those of ordinary skill in the art that various changes in form and details may be made therein without departing from the spirit and scope of the present invention as defined by the following claims and their equivalents. It is therefore desired that the present embodiments be considered in all respects as illustrative and not restrictive, reference being made to the appended claims rather than the foregoing description to indicate the scope of the invention.

What is claimed is:

1. A method for fabricating an organic light emitting display, the method comprising:
   preparing a stage having a hollow portion and a mask frame on or over the stage and coupled to a mask sheet;
   obtaining distance information between the stage and the mask frame;
   determining whether or not the obtained distance information between the stage and the mask frame corresponds to reference distance information; and
   controlling a source unit to provide a thin-film forming material toward the stage.

2. The method of claim 1, wherein the obtaining the distance information between the stage and the mask frame comprises using a displacement sensor on the stage to measure a distance between the stage and the mask frame.

3. The method of claim 2, wherein the determining whether or not the obtained distance information between the stage and the mask frame corresponds to the reference distance information is performed by a controller comprising an input unit receiving the obtained distance information between the stage and the mask frame, a memory unit storing the reference distance information, and a determination unit determining whether or not the obtained distance information between the stage and the mask frame corresponds to the reference distance information.

4. The method of claim 3, wherein the controller further comprises an output unit outputting a variable control signal according to whether or not the determination unit determines that the obtained distance information between the stage and the mask frame corresponds to the reference distance information.

5. The method of claim 4, wherein the controlling the source unit comprises a driving unit in the source unit driving the source unit to receive the variable control signal, and operating or stopping the source unit according to the received control signal.

6. The method of claim 5, wherein when the determination unit determines that the obtained distance information between the stage and the mask frame corresponds to the reference distance information, the output unit outputs a first control signal, and when the determination unit determines that the obtained distance information between the stage and the mask frame does not correspond to the reference distance information, the output unit outputs a second control signal, and when the first control signal is received, the driving unit operates the source unit, while when the second control signal is received, the driving unit stops the source unit.

7. The method of claim 1, further comprising generating an alarm when the obtained distance information between the stage and the mask frame does not correspond to the reference distance information.

8. The method of claim 1, further comprising displaying the obtained distance information between the stage and the mask frame and displaying whether or not the obtained distance information between the stage and the mask frame corresponds to the reference distance information.

9. The method of claim 1, wherein the obtaining the distance information between the stage and the mask frame and the determining whether or not the obtained distance information between the stage and the mask frame corresponds to the reference distance information are continuously performed while the controlling the source unit is performed.

10. The method of claim 9, further comprising stopping the source unit when it is determined that a distance between the stage and a substrate, which is estimated during performing of the controlling the source unit, does not correspond to the reference distance information.

11. The method of claim 1, wherein the obtaining the distance information comprises using a plurality of displacement sensors on the stage to measure a corresponding plurality of distances between the stage and the mask frame, one piece of the distance information being obtained by a corresponding one of the plurality of displacement sensors, and the determining whether or not the obtained distance information between the stage and the mask frame corresponds to the reference distance information comprises determining whether or not the pieces of the distance information correspond to the reference distance information.

12. A method for fabricating an organic light emitting display, the method comprising:

preparing a stage having a hollow portion and a mask frame on or over the stage and coupled to a mask sheet, and arranging a substrate on the mask sheet;

obtaining first distance information between the stage and the mask frame;

estimating a second distance between the stage and the substrate based on the obtained first distance information;

determining whether or not the estimated second distance corresponds to reference distance information; and controlling a source unit to provide a thin-film forming material toward the stage.

13. The method of claim 12, wherein the obtaining the first distance information comprises using a displacement sensor on the stage to measure a distance between the stage and the mask frame.

14. The method of claim 13, wherein the estimating the second distance and the determining whether or not the estimated second distance corresponds to the reference distance information are performed by a controller comprising an input unit receiving the obtained first distance information, an operation unit estimating the second distance a memory unit storing the reference distance information, and a determination unit determining whether or not the estimated second distance corresponds to the reference distance information.

15. The method of claim 14, wherein the controller further comprises an output unit outputting a variable control signal according to whether or not the determination unit determines that the estimated second distance corresponds to the reference distance information.

16. The method of claim 15, wherein the controlling the source unit comprises a driving unit included in the source unit driving the source unit to receive the variable control signal, and operating or stopping the source unit according to the received control signal.

17. The method of claim 16, wherein when the determination unit determines that the estimated second distance corresponds to the reference distance information, the output unit outputs a first control signal, while when the determination unit determines that the estimated second distance information does not correspond to the reference distance information, the output unit outputs a second control signal, and when the first control signal is received, the driving unit operates the source unit, while when the second control signal is received, the driving unit stops the source unit.

18. The method of claim 12, further comprising generating an alarm when the estimated second distance does not correspond to the reference distance information.

19. The method of claim 12, further comprising displaying the estimated second distance and displaying whether or not the estimated second distance corresponds to the reference distance information.

20. The method of claim 12, wherein the obtaining the first distance information, the estimating the second distance, and the deteunining whether or not the estimated second distance corresponds to the reference distance information are continuously performed while the controlling the source unit is performed.

21. The method of claim 20, further comprising stopping the source unit when the estimated second distance does not correspond to the reference distance information.

22. The method of claim 12, wherein the obtaining the first distance information comprises using a plurality of displacement sensors on the stage to measure a corresponding plurality of distances between the stage and the mask frame, one piece of the distance information being obtained by a corresponding one of the plurality of displacement sensors, the estimating the second distance comprises estimating a plurality of second distances, each of the estimated second distances corresponding to one piece of the distance information, and the determining whether or not the estimated second distance corresponds to the reference distance information comprises determining whether or not the plurality of estimated second distances corresponds to the reference distance information.

* * * * *